United States Patent [19]

Narimatsu et al.

[11] 4,361,805
[45] Nov. 30, 1982

[54] MAGNETORESISTIVE DISPLACEMENT SENSOR ARRANGEMENT

[75] Inventors: Akihisa Narimatsu, Tokyo; Hiroyuki Ohkubo, Chiba, both of Japan

[73] Assignee: Sony Corporation, Tokyo, Japan

[21] Appl. No.: 134,543

[22] Filed: Mar. 27, 1980

[30] Foreign Application Priority Data

Mar. 30, 1979 [JP] Japan .................................. 54-36845
Mar. 30, 1979 [JP] Japan .................................. 54-36847
Oct. 24, 1979 [JP] Japan ................................. 54-137289

[51] Int. Cl.$^3$ ........................ G01B 7/14; G01R 33/02
[52] U.S. Cl. ................................... 324/207; 324/252; 338/32 R
[58] Field of Search ...................... 324/207, 208, 252; 338/32 R; 365/158; 360/113

[56] References Cited
U.S. PATENT DOCUMENTS 3,949,346 4/1976 Makino et al. ................... 338/32 R
4,029,360 3/1978 Ookubo et al. ...................... 324/252

Primary Examiner—Gerard R. Strecker
Assistant Examiner—Walter E. Snow
Attorney, Agent, or Firm—Lewis H. Eslinger; Alvin Sinderbrand

[57] ABSTRACT

A magnetic sensor device utilizes the principle that the resistance of anisotropic magnetoresistive material is different in the case where the direction of current flowing in the material and the direction of a saturating magnetic field are parallel from the case where the direction of current and the direction of the saturating magnetic field are perpendicular to each other. The sensor device may be used to sense displacement and includes a ferromagnetic magnetoresistive element having at least one current path portion, a source applying electric current to each current path portion, and a magnetic field source producing first and second magnetic fields, occurring in first and second regions, and lying in first and second different mutually intersecting directions, respectively, with respect to the current path portion. The magnetoresistive element and the magnetic field source are displaceable in a predetermined direction relative to one another so that the relative amounts of the current path portion that are influenced by the first and second magnetic fields vary in accordance with such displacement. The magnetoresistive element can be connected to a constant current source, so that the voltage across the element indicates displacement. Alternatively, the magnetoresistive element can be formed of two series-connected current path portions, with a constant voltage source connected across both portions, so that the voltage appearing at the junction of the two current path portions indicates displacement.

49 Claims, 38 Drawing Figures

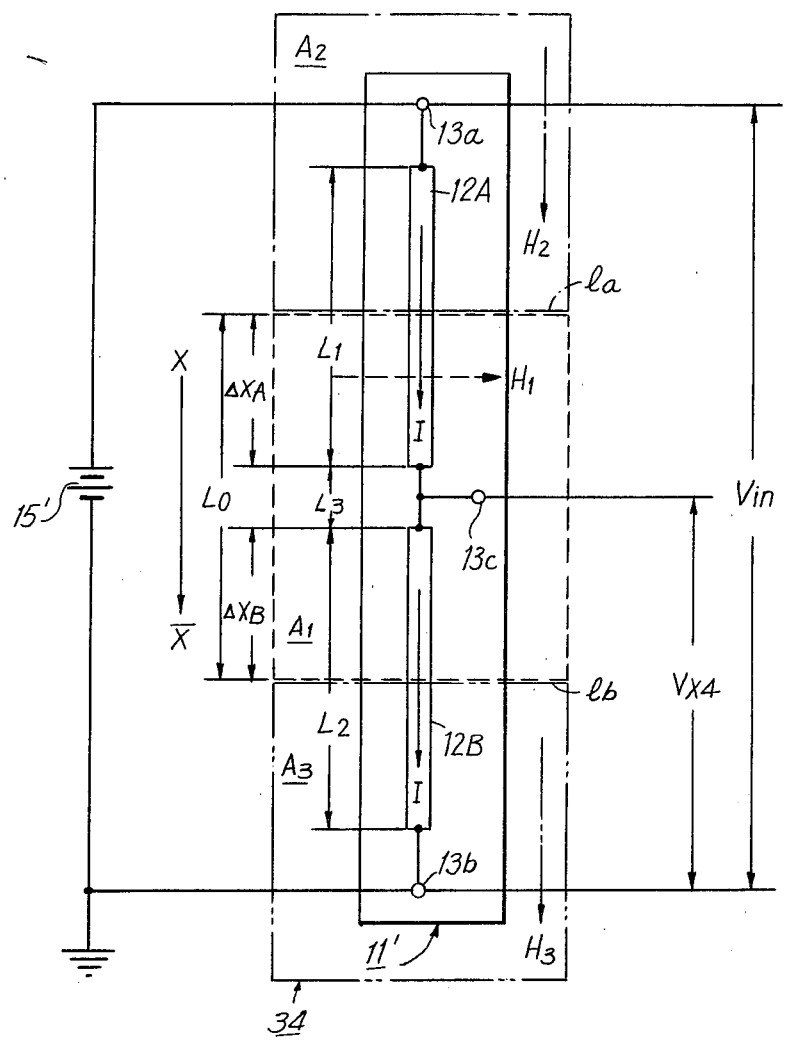

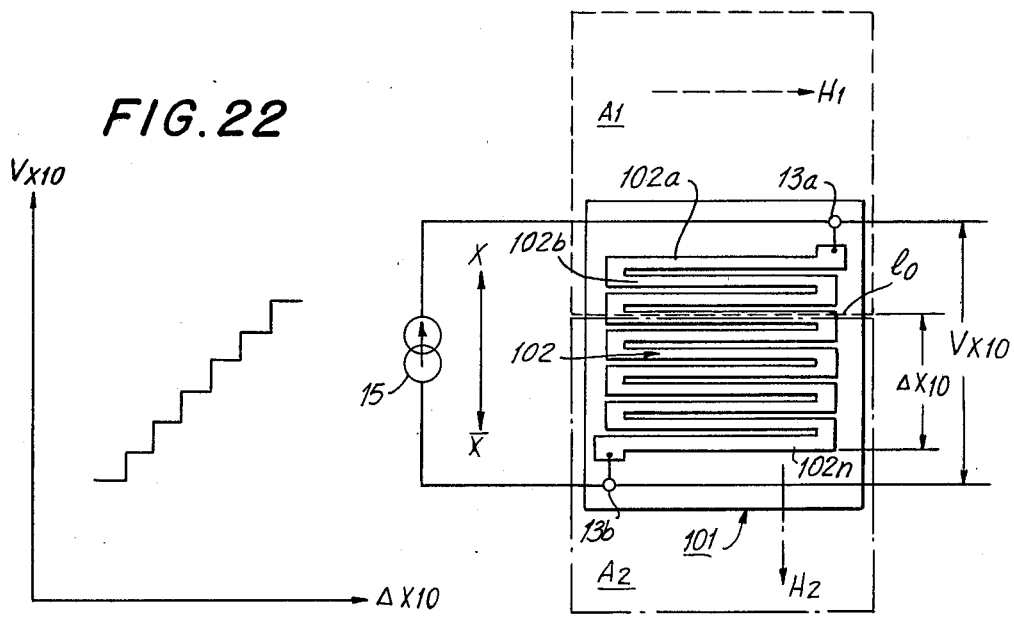
FIG. 21
FIG. 22
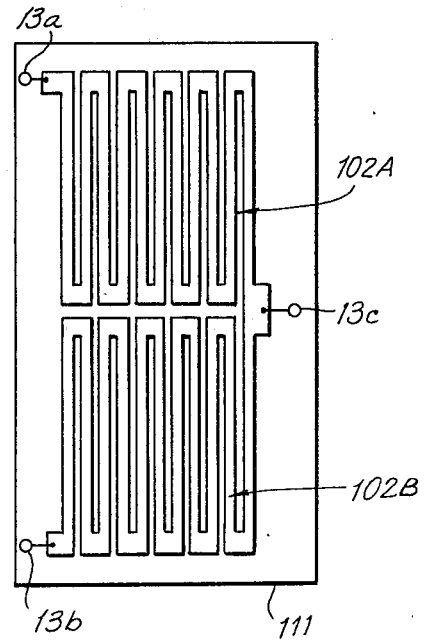
FIG. 23

MAGNETORESISTIVE DISPLACEMENT SENSOR ARRANGEMENT

BACKGROUND OF THE INVENTION

1. Field of the Invention

This invention relates generally to magnetic field sensing devices, and more particularly, relates to a device for detecting displacement of a magnetoresistive element relative to a magnetic field.

2. Description of the Prior Art

Magnetic field sensors which provide an output voltage that varies in response to a changing magnetic field are widely used in instrumentation, both in precision measurement laboratory equipment and also in business equipment such as weighing scales, and also to perform such functions as controlling the rotation of a motor. Such magnetic sensor elements are also used in contactless switches and volume adjusting controls in audio equipment.

Such a magnetic sensor device can be constructed using a ferromagnetic metal element, a semiconductor magnetoresistive element, or a hall element. Heretofore, semiconductor magnetoresisitive elements and hall elements have been principally used in prior art magnetic sensor elements. However, semiconductor magnetoresistive elements and hall elements have characteristics which depend on the properties of the semiconductor material being used. For example, in magnetoresistive elements formed of semiconductor materials such as GaAs, InSb, or other magnetoresistive semiconductors, the charge carrier density and the ability of such charge carriers to move in the material is highly dependent upon temperature. Thus semiconductor magnetoresistive elements and hall elements have adverse temperature sensitivities, and have large variations in resistivity within the element, thereby requiring that an external temperature compensation circuit and a circuit to compensate for the dispersion resistivity be included. Furthermore, because the resistivity of the semiconductor magnetoresistive element varies approximately as the square of the intensity of the magnetic field when the latter is small, a relatively large magnetic field, such as one kilogauss, of bias magnetisim is usually required. Because the required flux density is so high the bias magnetic field cannot be provided with sufficient uniformity over a large region, and thus there will be lack of linearity of resistance throughout the element. As a result, it is extremely difficult for a magnetic sensor device using such a semiconductor magnetoresistive element to measure fine displacement with satisfactory linearity.

It is also known to use magnetoresistive elements formed of ferromagnetic material. Devices using such magnetoresistive elements to sense magnetic fields are described in U.S. Pat. Nos. 3,928,836; 3,949,345; 4,021,728; 4,053,829; and 4,021,728, each of which has been assigned to the assignee of the present application.

The magnetoresistive effect of ferromagnetic material, as used in such ferroresistive elements, can be explained by two separate phenomena.

The first phenomenon is the change in resistance which is produced through the change in self-magnetization caused by an outside magnetic field. This phenomenon can be explained by Mott's theory. In general, this first phenomenon results in the linear reduction of the resistivity of the device as the magnetic field is increased, and is isotropic with respect to the direction of the magnetic field. However, while this phenomenon is significant when the ferromagnetic material is heated to its curie temperature, where self-magnetization is most intense, but can be neglected so long as the external magnetic field is relatively small and the temperature is low.

The second phenomenon can be observed in a relatively small magnetic field, because the magnetoresistive effect in this phenomenon is anisotropic, that is, the resistivity of the ferromagnetic material depends on the angle between the direction of magnetization and the direction of current flow. This phenomenon is most intense in the temperature region where the change in self-magnetization is small, and grows smaller gradually as the temperature of the material is increased towards the curie temperature.

Generally, in a ferromagnetic metal, the resistivity is at a maximum when the directions of current and magnetization are parallel, and is at a minimum when those directions are perpendicular to one another. The phenomenon can be expressed in terms of the well-known Voight-Thomson formula;

$$\rho(\theta) = \rho_\perp \sin^2 \theta + \rho_\parallel \cos^2 \theta \tag{1}$$

where $\rho_\perp$ and $\rho_\parallel$ are the resistivity of the ferromagnetic material when saturated with a magnetic field perpendicular to the direction of current flow, and parallel to the direction of current flow, respectively, and where $\theta$ is the angle between the direction of current flow and the direction of saturated magnetization. Ferromagnetic magnetoresistive elements utilizing this second phenonmenon are described in the aforementioned U.S. patents.

OBJECTS AND SUMMARY OF THE INVENTION

It is an object of the present invention to provide a magnetic displacement sensor device which detects relative displacement between a source of magnetic field and a magnetoresistive element.

It is another object of this invention to provide a magnetic displacement sensor device which produces an output voltage which varies in accordance with the relative displacement between a source of magnetic field and a magnetoresistive element.

It is a further object of this invention to provide a magnetic displacement sensor device which provides an output voltage which varies in accordance with the ratio of magnetoresistive current path portions which are influenced by magnetoresistive fields having respectively different directions.

It is yet another object of this invention to provide a magnetic sensor device in which regions of a magnetic field in a first direction and in a second direction abut one another at a boundary line, and the magnetic displacement sensor device provides an output voltage which varies in relation to the relative displacement of the ferromagnetic element and the boundary line.

It is yet a further object of this invention to provide a magnetic displacement sensor device in which a relatively simple arrangement of magnetizing material provides magnetic fields having different directions to influence the magnetoresistive device.

It is a still further object of this invention to provide a magnetic displacement sensor device which is highly sensitive to relative displacement between the magnetoresistive element and the source of magnetic fields.

It is still another object of the present invention to provide a magnetic displacement sensor device to which a source of constant voltage can be provided.

It is yet still another object of the present invention to provide a magnetic displacement sensor device which is substantially temperature independent.

It is a still further object of the present invention to provide a magnetic displacement sensor device exhibiting excellent linearity in the relation of its output voltage to relative displacement between the magnetoresistive element and the source of magnetic fields.

It is yet another object of the present invention to provide a magnetic displacement sensor device which is capable of detecting fine displacement.

It is still yet another object of the present invention to provide a magnetic displacement sensor device in which the output voltage of the device varies stepwise with relative displacement between the magnetoresistive element and the source of magnetic fields.

It is a still yet further object of the present invention to provide a magnetic displacement sensor which can be constructed so that the relationship of output voltage to relative displacement of the magnetoresistive element to the source of magnetic fields varies according to an arbitrary function.

According to an aspect of the present invention, a magnetic displacement sensor device comprises a magnetoresistive element having at least one current path portion formed of ferromagnetic material, a power source supplying a current to the magnetoresistive element to flow along the at least one current path portion; an arrangement of magnets providing a first magnetic field and a second magnetic field lying at different mutually intersecting first and second directions in respect to the at least one current path, and occurring in first and second regions, respectively, the magnetoresistive element and the arrangement of magnets being displaceable in a predetermined direction relative to one another so that the relative amounts of the at least one current path portion that are influenced by the first magnetic field and by the second magnetic field vary in accordance with such displacement.

The magnetoresistive element can be connected to a constant current source, so that the voltage across the element indicates displacement. Alternatively, the magnetoresistive element can be formed of two series-connected path portions, with a constant voltage source connected across both current path portions. In such an element, the voltage appearing at the junction of the two current path portions indicates displacement.

Preferably, the current path portion of the magnetoresistive element is formed of a metal film of a ferromagnetic alloy, such as Ni-Co, Ni-Fe, Ni-Al, Ni-Mn, or Ni-Zn. The current path portion of the magnetoresistive element can be formed as a serpentine pattern of parallel strips connected in series together. If these strips are arranged parallel to the predetermined direction of translation of the magnetoresistive elements, the magnetic displacement sensor device will be able to detect fine displacement with a high degree of accuracy. If the strips are arranged perpendicular to the predetermined direction of displacement, the magnetic displacement sensor device will provide an output voltage which varies in a stepwise fashion with displacement.

The above, and other objects, features and advantages of the invention will be apparent in the following detailed description of illustrative embodiments when read in conjunction with the accompanying drawings.

BRIEF DESCRIPTION OF THE DRAWINGS

FIG. 9 is a plan view of a fourth embodiment of the present invention;

FIG. 21 is a plan view showing a tenth embodiment of this invention;

FIG. 22 is a graph showing the relation of output voltage to displacement in the tenth embodiment of this invention;

FIG. 23 is a plan view showing an arrangement of the magnetoresistive element of this invention;

DETAILED DESCRIPTION OF THE PREFERRED EMBODIMENTS

Figure 1:
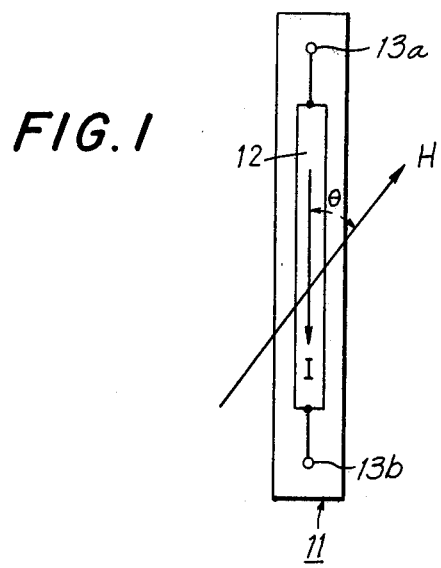
FIG. 1 is a schematic illustration of the basic construction of a magnetoresistive element for use in a magnetic displacement sensor device according to the present invention.

With reference to the drawings, and initially to FIG. 1 thereof, a magnetoresistive element 11 has a current path portion 12 in which a current I flows from a first current terminal 13a to a second current terminal 13b. A magnetic field H sufficient to saturate the material of the current path portion 12 lies along the direction, as indicated by the arrow, at an angle $\theta$ with respect to the direction of flow of current I. Current path portion 12 is preferably formed of a film of ferromagnetic material, such as Ni-Co, Ni-Fe, Ni-Al, Ni-Mn or Ni-Zn. Current path portion 12, if constructed of any of the foregoing alloys, will exhibit resistance characteristics as expressed in the aforementioned Voight-Thomson formula.

In the embodiments of the invention to be described hereinafter, component elements which are similar or correspond to earlier described elements will be identified with like reference characters, and repeated detailed discussions of such elements will be omitted.

Figure 2:
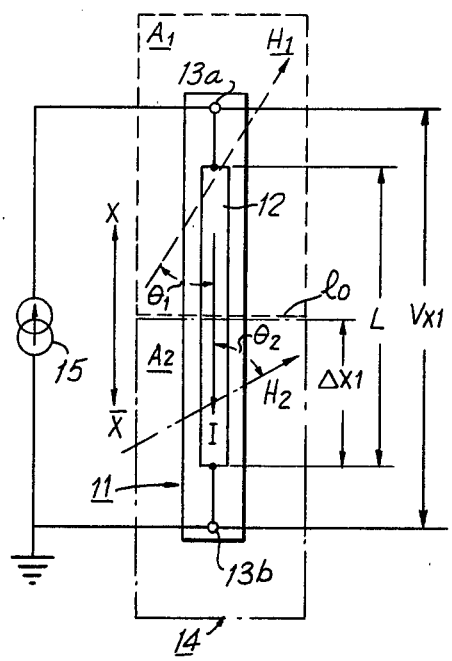
FIG. 2 is a plan view of a first embodiment of the present invention.

FIG. 2 illustrates a first embodiment of a magnetic displacement sensor device according to this invention. An element of magnetizing material 14 is positioned with respect to magnetoresistive element 11 so that the latter can be saturated by flux from magnetizing material 14. Magnetizing material 14 here consists of a first region $A_1$ that provides a first magnetic field $H_1$ in the direction as shown by the broken line arrow, and a second region $A_2$ that provides a second magnetic field $H_2$ in the direction as shown by the dot-and-dash line arrow. The first and second regions $A_1$ and $A_2$ of the magnetizing material 14 abut one another at a boundary line $l_0$. Magnetizing material 14 and the magnetoresistive device 11 are arranged for relative displacement in the direction across the boundary line $l_0$ and along the direction of the flow of the current I, i.e., in the direction of the double-headed arrow X—X.

Generally, the ferromagnetic material of the current path portion 12 will exhibit a greater resistance when the direction of flow of current I and the direction of magnetic field are aligned, and a smaller resistance when the direction of flow of current I and the direction of the magnetic field are perpendicular to each other. The resistivity, or value of resistance per unit length, $\rho(\theta) = \rho_\perp \sin^2\theta + \rho_\| \cos^2\theta$ (usually expressed in terms of ohms per centimeter) can be expressed as a function of the angle $\theta$ between the directions of the current flow and magnetiziation, according to the Voight-Thomson formula. Thus, in the first embodiment as shown in FIG. 2, the material forming the current path portion 12 overlying the region $A_1$ of the magnetizing material 14, will have a resistivity of $\rho_1$ according to the following equation:

$$\rho_1 = \rho_\perp \sin^2\theta_1 + \rho_\| \cos^2\theta_1 \qquad (2)$$

where $\theta_1$ is the angle between the direction of the first magnetic field $H_1$ and the direction of flow of current I. Similarly, that part of current path portion 12 which overlies the second region $A_2$ of the magnetizing material 14 will exhibit a resistivity $\rho_2$ which can be expressed according to the following relationship:

$$\rho_2 = \rho_\perp \sin^2\theta_2 + \rho_\| \cos^2\theta_2 \qquad (3)$$

where $\theta_2$ is the angle between the direction of the second magnetic field $H_2$ and the direction of the flow of current I. A constant current source 15 is connected at one end to terminal 13a and at the other end to terminal 13b and to ground. As current source 15 applies a constant bias current I across the current path of portion 12, the output voltage $V_{x1}$ taken across the terminals 13a, 13b can be represented according to the following relationship:

$$V_{x1} = I[\Delta x_1 \rho_2 + (L - \Delta x_1)\rho_1] \qquad (4)$$
$$= I(\alpha - 1)\rho_1 \Delta x_1 + IL\rho_1$$

where L is the total length of the current path portion 12, $\Delta x_1$ is the length of the current path portion 12 which overlies the second region $A_2$, and $\alpha$ is a constant determined according to the following relationship:

$$\alpha = \rho_2/\rho_1 \qquad (5)$$

Figure 3:
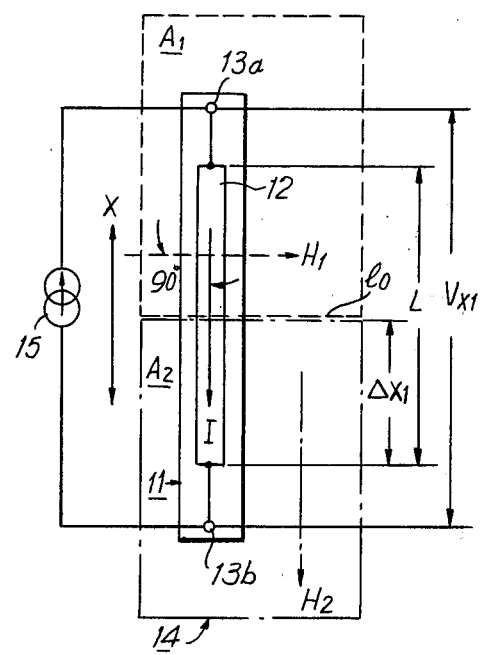
FIG. 3 is a plan view showing an optimum arrangement of the first embodiment of this invention.

Here the constant $\alpha$ can assume any value other than unity depending upon the direction of the magnetic fields $H_1$ and $H_2$ in respect to the direction of flow of current I. The constant $\alpha$ will, of course, assume a maximum value when the first magnetic field $H_1$ is perpendicular to the direction of current flow and the second magnetic field $H_2$ is parallel to the direction of current flow. FIG. 3 represents the optimum arrangement of the first embodiment of this invention, in which magnetic field $H_1$ is perpendicular to the current path portion 12 while magnetic field $H_2$ is parallel thereto. Thus, the part of current path portion 12 overlying the first region $A_1$ is saturated by magnetic field $H_1$ in the direction perpendicular to the direction of flow of current I, while the part of current path portion 12 overlying the second region $A_2$ is saturated in the direction along the direction of flow of current I. The sensivitity of the magnetic displacement sensor device for detecting relative displacement between the magnetizing material 14 and the magnetoresistive element 11 is maximized.

As is apparent from equation (4), the output voltage $V_{x1}$ appearing across terminals 13a, 13b in this embodiment will take on a value proportional to the length $\Delta x_1$. Thus, the output voltage $V_{x1}$ will vary in an amount that is directly proportional to the displacement of the magnetoresistive element 12 is relation to the boundary line $l_0$.

Figure 4:
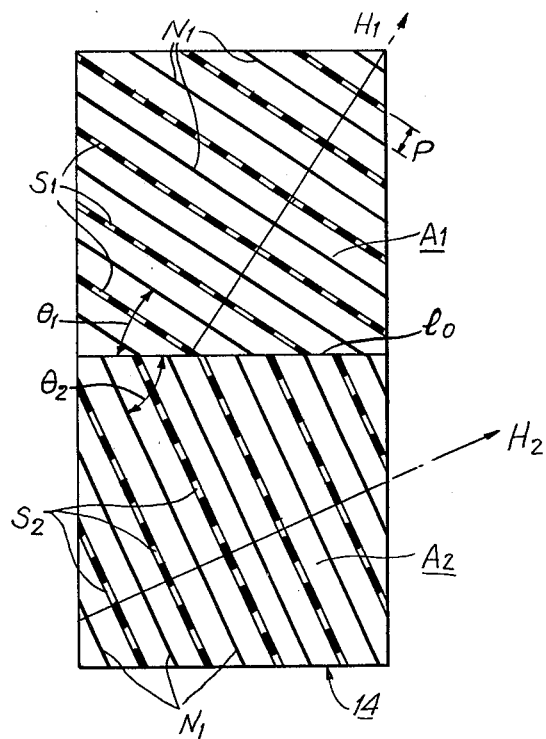
FIG. 4 is a plan view showing a preferred magnetization pattern for magnetic material to be used in the first embodiment of this invention.

With reference to FIG. 4, the magnetizing material 14 as used in the first embodiment of this invention is preferably formed with the regions $A_1$ and $A_2$ thereof constructed as zone-magnetized regions. For example, in the zone-magnetized region $A_1$, longitudinal north poles $N_1$ alternate with longitudinal south poles $S_1$, and in the region $A_2$, longitudinal north poles $N_2$ alternate with longitudinal south poles $S_2$. Here the interval between successive north and south longitudinal poles is indicated as the length P. As the longitudinal direction of the poles $N_1, S_1, N_2, S_2$, is perpendicular to the direction of the respective magnetic field, $H_1, H_2$, these longitudinal magnetic poles $N_1, S_1$, and $N_2, S_2$, will intersect the boundary line $l_0$ at the angles $\theta_1$ and $\theta_2$, respectively. In the arrangement as shown in FIG. 4, the amount of interaction of the magnetic fields $H_1$ and $H_2$ in the neighborhood of the boundary line $l_0$ can be minimized by reducing the interval P between successive poles $N_1, S_1$ and $N_2, S_2$, in the zone-magnetized area $A_1$ and $A_2$, respectively, so that the boundary line $l_0$ clearly defines the areas of influence of the first and second magnetic fields $H_1$ and $H_2$.

Figure 5:
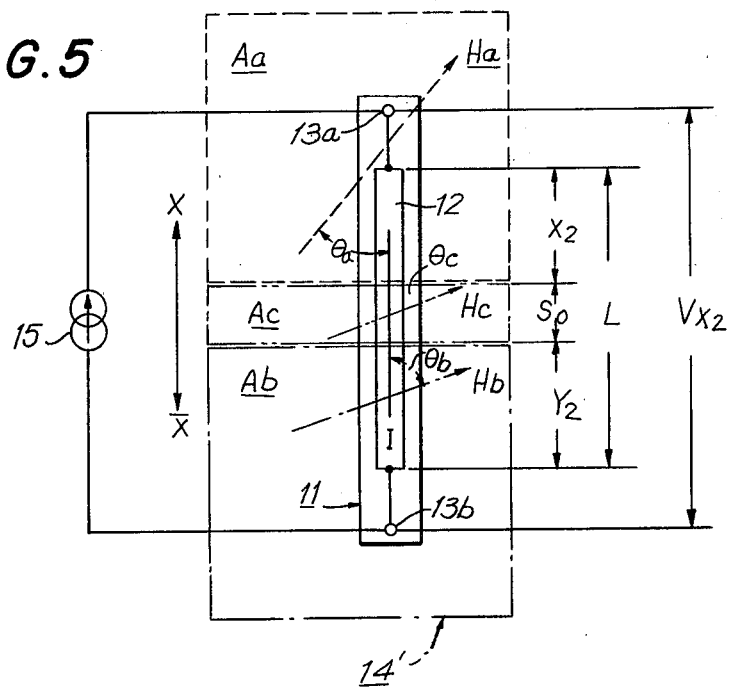
FIG. 5 is a plan view of a second embodiment of this invention.

With reference to FIG. 5, a second embodiment of this invention illustrates that it is not necessary that regions $A_1$ and $A_2$ of the magnetizing material 14 be separated by a single clear boundary line $l_0$. In this embodiment, a first region $A_a$ and a second region $A_b$ of the magnetizing material 14 are separated by a third region $A_c$ of a predetermined width $S_0$. Here, one end of current path portion 12 extends over the region $A_a$ and the other end thereof extends over the region $A_b$. The part of current path portion 12 extendng over region $A_a$ has a length $X_2$ and the part of current path portion 12 extending over the region $A_b$ has a length $Y_2$, so that the total length L of the current path portion is the sum of the lengths $X_2$, $S_0$ and $Y_2$. The region $A_a$ produces a magnetic field $H_a$ at an angle $\theta_a$ in respect to the direction of flow of current I, the region $A_b$ provides a magnetic field $H_b$ at another angle $\theta_b$ in respect to the direction of flow of current I, and the third or central region $A_c$ provides a magnetic field $H_c$ at an angle $\theta_c$ intermediate the angles $\theta_a$ and $\theta_b$. In the second embodiment, the total resistance value $R_t$ between the terminals 13a and 13b of current path portion 12 can be expressed according to the following equation:

$$R_t = X_2(\rho_\perp \sin^2\theta_a + \rho_\parallel \cos^2\theta_a) + \quad (6)$$

$$Y_2(\rho_\perp \sin^2\theta_b + \rho_\parallel \cos^2\theta_b) +$$

$$\int_0^{S_0} \int_{\theta_2}^{\theta_b} (\rho_\perp \sin^2\theta_c + \rho_\parallel \cos^2\theta_c) d\theta_c dS$$

If, for example, it is assumed that $\theta_a = 0$, $\theta_b = \pi/2$, and $\theta_c$ takes on any value such that $0 \leq \theta_c \leq \pi/2$, the above equation (6) can be smplified as follows:

$$R_t = X_2\rho_\parallel + Y_2\perp + \int_0^{S_0}\int_0^{\frac{\pi}{2}} (\rho_\perp \sin^2\theta_c + \rho_\parallel \cos^2\theta_c) d\theta dS \quad (7)$$

$$= X_2\rho_\parallel + (L - X_2 - S_0)\rho_\perp + S_0\rho_\perp \left[\frac{\theta_c}{2} - \frac{\sin 2\theta_c}{4}\right]_0^{\frac{\pi}{2}}$$

$$+ S_0\rho_\parallel \left[\frac{\theta_c}{2} + \frac{\sin 2\theta_c}{4}\right]_0^{\frac{\pi}{2}}$$

$$= X_2(\rho_\parallel - \rho_\perp) + (L - S_0)\rho_\perp + \frac{\pi S_0}{4}(\rho_\perp + \rho_\parallel).$$

As is apparent from the above equation (7), even though first and second regions $A_a, A_b$ do not abut one another directly, but are separated by a third region $A_c$ of predetermined width $S_0$, the total resistance $R_t$ of the current path portion 12 varies linearly with the change in the length $X_2$ and therefore the change in resistance $R_t$ will vary directly with the relative displacement of magnetizing material 14 and current path portion 12, so long as both ends of the current path portion 12 remain in the respective regions $A_a$ and $A_b$. Therefore, in the second embodiment as shown in FIG. 5, the output voltage $V_{x2}$ as measured across the terminals 13a and 13b will vary linearly with the relative displacement between magnetizing material 14 and magnetoresistive element 11.

Figure 6:
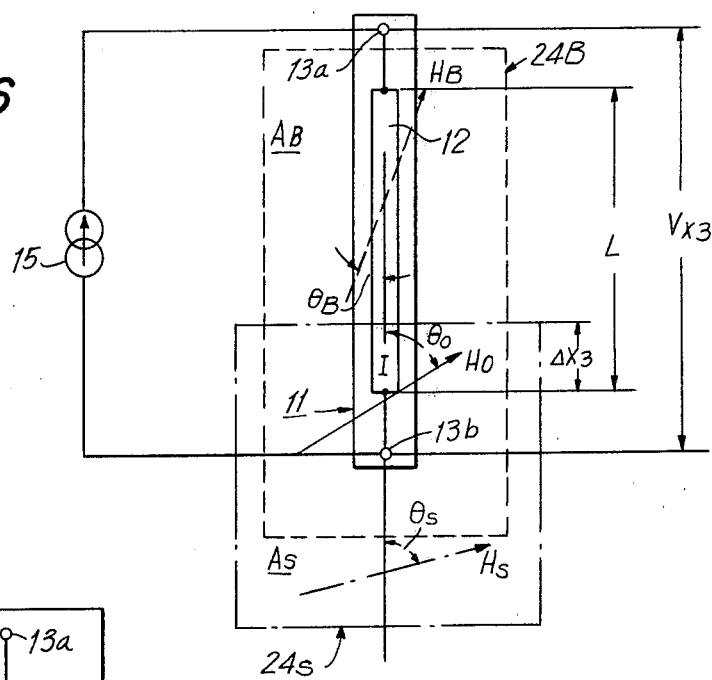
FIG. 6 is a plan view of a third embodiment of this invention.

FIG. 6 illustrates a third embodiment of the magnetic displacement sensor device according to the present invention. Similarly to the previously-described embodiments, the embodiment of FIG. 6 includes a magnetoresistive element 11 having a flat strip-like current path portion 12 formed of anisotropic ferromagnetic material and a constant current source 15 connected to terminals 13a and 13b of the magnetoresistive element 11. However, in the third embodiment, a biasing magnet $24_B$ and a signal magnet $24_S$ are provided to influence the current path portion 12. In this embodiment, biasing magnet $24_B$ is fixed relative to magnetoresistive element 11 which signal magnet $24_S$ and magnetoresistive element 11 are displaceable relative to one another. The bias magnet $24_B$ provides a bias magnetic field $H_B$ at a predetermined angle $\theta_B$ in relation to the direction of the flow of current I, and the signal magnet $24_S$ provides a signal magnetic field $H_S$ in a different direction $\theta_S$ relative to the direction of flow of current I. The resistivity of that part of current path portion 12 saturated by the bias magnetic field $H_B$ is given according to the following equation:

$$\rho_B = \rho_\perp \sin^2\theta_B + \rho_\parallel \cos^2\theta_B \quad (8)$$

The remaining part of the current path portion 12 which is influenced by the bias magnet $24_S$ will be saturated in the direction of a magnetic field $H_0$ which is the vector sum of bias magnetic field $H_B$ and signal magnetic field $H_S$. The resistivity of such part of the current path portion is given according to the following relation:

$$\rho(\theta_0) = (\rho_\perp \sin^2\theta_0 + \rho_\parallel \cos^2\theta_0) \quad (9)$$

The length of the part of the current path portion 12 influenced by signal magnet $24_S$ is $\Delta_{x3}$ and such part is subjected to the vector resultant or field $H_0$. The length of the part of the current path portion influenced only by the bias magnetic field $H_B$ is $L - \Delta x3$. Thus, the output voltage $V_{x3}$ obtained across terminals 13a and 13b is expressed according to the following equation:

$$V_{x3} = I(L - \Delta x3)(\rho_\perp \sin^2\theta_B + \rho_\parallel \cos^2\theta_B) + I\Delta x3(\rho_\perp \sin^2\theta_0 + \rho_\parallel \cos^2\theta_0) = IL(\rho_\perp \sin^2\theta_B + \rho_\parallel \cos^2$$

$$\theta_B)+I\Delta X_3[\rho_\perp(\sin^2\theta_0-\sin^2\theta_B)+\rho_\parallel(\cos^2\theta_0-\cos^2\theta_B)] \quad (10)$$

Figure 7:
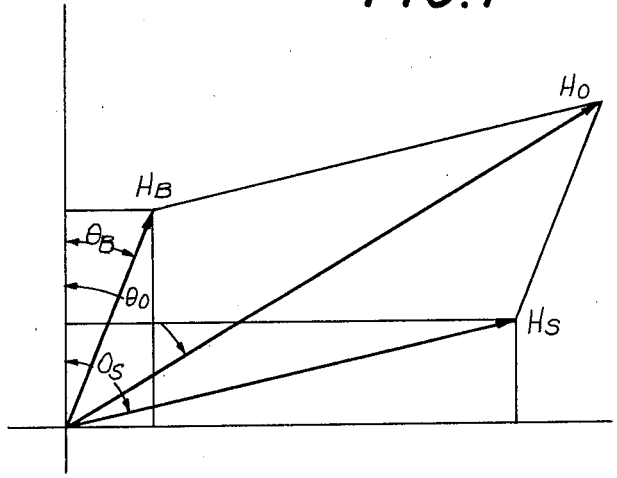
FIG. 7 is a vector diagram for illustrating the coaction of magnetic fields in the third embodiment of this invention.

FIG. 7 illustrates the relationship of the vector resultant field $H_0$ to the bias field $H_B$ and the signal field $H_S$. As is apparent from a consideration of equation (10), the output voltage $V_{x3}$ will be proportional to the length $\Delta_{x3}$ of the part of current path portion 12 located within the influence of the signal magnetic field $H_S$ so long as the directions of the bias magnetic field $H_B$ and signal magnetic field $H_S$ are constant.

It should be further understood that, in the third embodiment of this invention, if the direction of the bias magnetic field $H_B$ is parallel to the direction of flow of current I and the signal field $H_S$ is so directed that the vector resultant field $H_0$ is directed perpendicular to the direction of flow of current I, the sensitivity of the magnetic displacement sensor device for detecting relative displacement of the signal magnet $24_S$ and the magneto-resistive element 11 will be maximized. This condition can be approximated if the strength of the signal field $H_S$ is considerably greater than the strength of the bias field $H_B$. Under these ideal conditions, the output voltage $V_{x3}$ for $\theta_B=0$ and $\theta_0=\pi/2$, can be expressed according to the following equation:

$$V_{x3}\approx I(L-\Delta x_3)\rho_\parallel+I\Delta X_3\rho_\perp\approx IL\rho_\parallel+I\Delta x_3(\rho_\parallel-\rho_\perp) \quad (11)$$

Figure 8:
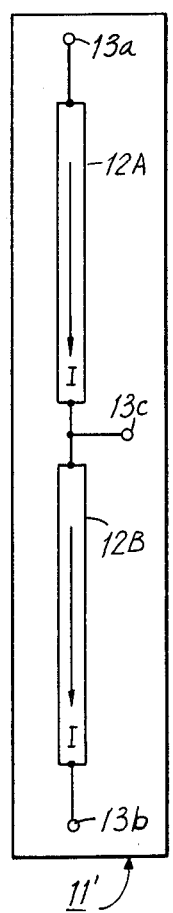
FIG. 8 is a plan view illustrating the construction of another magnetoresistive element for use in a magnetic displacement sensor device according to this invention.

FIG. 8 illustrates an alternative arrangement of a magnetoresistive element 11' according to this invention. In such arrangement, first and second current path portions 12A and 12B are coupled in series between current input terminals 13a and 13b. The junction formed between current path portions 12A and 12B is connected to an output voltage terminal 13c. Thus, magnetoresistive element 11' is arranged as a voltage divider with the voltage output terminal 13c being its center tap. This magnetoresistive element 11' can be used to advantage in the present invention, as illustrated in the following embodiments.

FIG. 9 shows a fourth embodiment of this invention which constitutes, in effect, a potentiometer arranged in a form similar to that of the first embodiment of this invention. A constant voltage source 15' is connected to terminals 13a and 13b, and the latter terminal is connected to ground. In this embodiment, an element of magnetizing material 34 has a first area $A_1$ flanked on opposite sides by a second area $A_2$ and a third area $A_3$. The first and second areas $A_1$ and $A_2$ abut one another at boundary line $l_a$ and the first and third areas $A_1$ and $A_3$ abut one another at another boundary line $l_b$ parallel to boundary line $l_a$. The magnetoresistive element 11' is arranged for displacement relative to the magnetic material 34 in the predetermined direction X—X perpendicular to the boundary lines $l_a$ and $l_b$ and the first and second current path portions 12A and 12B lie across the boundary lines $l_a$ and $l_b$, respectively. In this fourth embodiment, magnetic field $H_1$ lies in the direction perpendicular to the direction of the flow of current I in the current path portions 12A and 12B. Magnetic field $H_2$ lies in the direction parallel to the direction of the flow of current I, and the third region $A_3$ provides a magnetic field $H_3$ parallel to magnetic field $H_2$ and also parallel to the direction of flow of current I. In the fourth embodiment, the first and second current path portions 12A and 12B change their resistivity characteristic differentially, so that the resistance value of one increases while the resistance value of the other decreases. In other words, as the magnetoresistive element 11' is displaced relative to the magnetic material 34, the sum of the lengths of the parts of current path portions 12A and 12B influenced by the magnetic field $H_1$ remains a constant, and the sum of the length of the part of current path portion 12A influenced by the magnetic field $H_2$ and the length of the part of current path portion 12B influenced by the magnetic field $H_3$ also remains a constant. Thus, if a constant voltage is applied across terminals 13a and 13b, the current I flowing through the current path portions 12A and 12B will also be a constant regardless to the relative displacement of the element 11' and the magnetizing material 34. Current I will have a value which is expressed according to the following equation:

$$I=V_{in}/(R_a+R_b) \quad (12)$$

where $V_{in}$ is the voltage applied across the terminals 13a and 13b by constant voltage source 15', and $R_a$ and $R_b$ are the resistance values of first and second current path portions 12A and 12B, respectively. Of course, the respective values $R_a$ and $R_b$ can be calculated by using the Voight-Thomson formula expressed above.

In particular, if it is assumed that the total length of first current path portion 12A is $L_1$, the total length of second current path portion 12B is $L_2$, and the interval between the first and second current path portions 12A and 12B is $L_3$, and if it is further assumed that the length of the first region $A_1$ between boundary lines $l_a$ and $l_b$ is $L_0$, the length of the part of first current path portion 12A influenced by the first magnetic field $H_1$ is $\Delta xA$ and the length of the part of second current path portion 12B influenced by the first magnetic field is $\Delta xB$ then the resistance values $R_a$ and $R_b$ can be expressed according to the following equations:

$$R_a=(L_1-\Delta x_A)(\rho_\perp\sin^2\theta_2+\rho_\parallel\cos^2\theta_2)+\Delta X_A(\rho_\perp\sin^2\theta_1+\rho_\parallel\cos^2\theta_1) \quad (13)$$

$$R_b=(L_2-\Delta x_B)(\rho_\perp\sin^2\theta_3+\rho_\parallel\cos^2\theta_3)+\Delta x_B(\rho_\perp\sin^2\theta_1+\rho_\parallel\cos^2\theta_1) \quad (14)$$

Thus, it is apparent that the total resistance $R_a+R_b$ across the terminals 13a and 13b of the magnetoresistive element 11' is expressed according to the following equation:

$$\begin{aligned}R_a+R_b&=(L_1-\Delta x_A)(\rho_\perp\sin^2\theta+\rho_\parallel\cos^2\theta_2)+\Delta x_A(\rho_\perp\sin^2\theta_1+\rho_\parallel\cos^2\theta_1)\\&+(L_2-\Delta x_B)(\rho_\perp\sin^2\theta_3+\rho_\parallel\cos^2\theta_3)+\Delta X_B(\rho_\perp\sin^2\theta_1+\rho_\parallel\cos^2\theta_1)\\&=L_1(\rho_\perp\sin^2\theta_1+\rho_\parallel\cos^2\theta_1)+L_2(\rho_\perp\sin^2\theta_3+\rho_\parallel\cos^2\theta_3)\\&-\Delta X_A(\rho_\perp\sin^2\theta_2+\rho_\parallel\cos^2\theta_2)+\Delta X_B(\rho_\perp\sin^2\theta_3+\rho_\parallel\cos^2\theta_3)\\&+(\Delta X_A+\Delta X_B)(\rho_\perp\sin^2\theta_1+\rho_\parallel\cos^2\theta_1)\end{aligned} \quad (15)$$

However, in respect to this fourth embodiment, the above equation (15) can be considerably simplified, since $\theta_1=90°$, $\theta_2=\theta_3=0°$, and $L_0-L_3=\Delta x_A+\Delta x_B$. Thus, the total resistance value $R_a+R_b$ takes on a constant value, regardless of the relative displacement of the magnetizing material 34 and the magnetoresistive element 11', as expressed in the following equation:

$$\begin{aligned}R_a+R_b&=(L_1+L_2)(\rho_\perp\sin^2\theta_2+\rho_\parallel\cos^2\theta_2)-(L_0-L_3)(\rho_\perp\sin^2\theta_2+\rho_\parallel\cos^2\theta_2)\\&+(L_0-L_3)(\rho_\perp\sin^2\theta_1+\rho_\parallel\cos^2\theta_1)\\&=(L_1+L_2)\rho_\parallel-(L_0-L_3)(\rho_\parallel-\rho_\perp)=(L_1+L_2+L_3-L_0)\rho_\parallel+(L_0-L_3)\rho_\perp\end{aligned} \quad (16)$$

If in this fourth embodiment, each of the lengths $L_1=L_2=L_0$ and $\Delta x_A+\Delta x_B=L_0-L_3=L_4$, so that the output voltage $V_{x4}$, appearing at voltage output terminal 13c can be expressed according to the following equation:

$$V_{x4} = \frac{\rho_b}{\rho_a + \rho_b} V_{in} \tag{17}$$

$$= \frac{L_2 \rho_{\|}}{(2L_0 - L_4)\rho_{\|} + L_4\rho_\perp} \cdot V_{in} -$$

$$\frac{(\rho_{\|} - \rho_\perp)}{(2L_0 - L_4)\rho_{\|} + L_4\rho_\perp} \cdot \Delta x_B V_{in}$$

As the first term on the right-hand side of equation (22) represents a constant voltage, and the second term thereof represents a voltage which varies linearly with relative displacement $\Delta x_B$, it is apparent that the fourth embodiment of this invention will provide an accurate voltage from which the relative displacement of the magnetic material 34 and the element 11' can be sensed.

Figure 10:
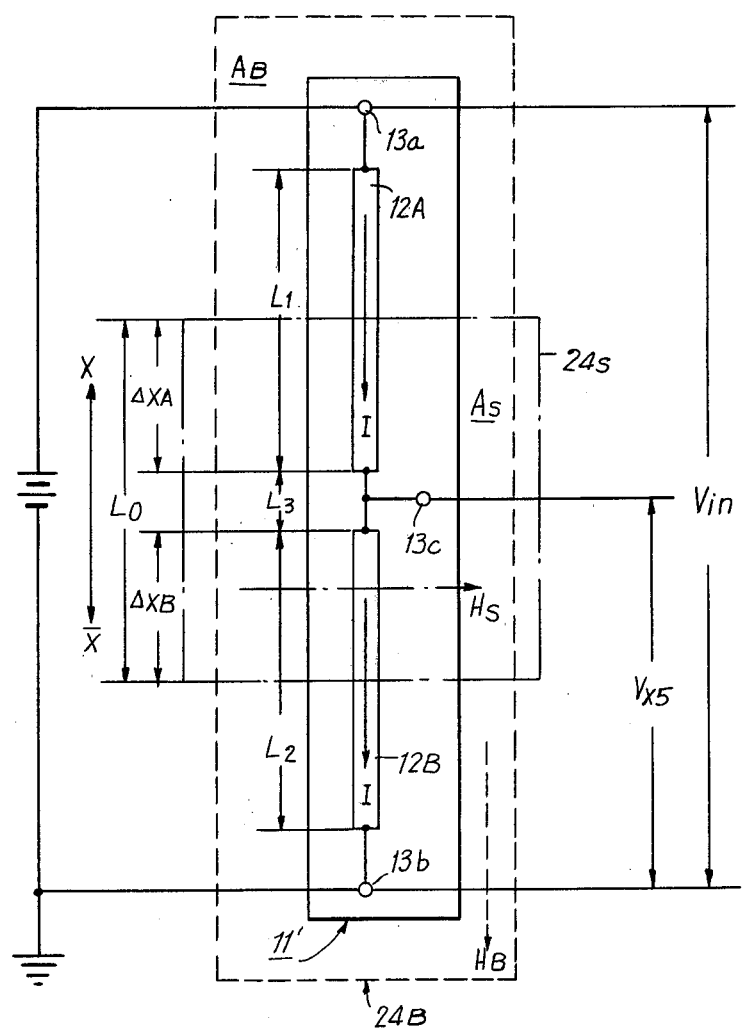
FIG. 10 is a plan view of a fifth embodiment of the present invention.

FIG. 10 illustrates a fifth embodiment of this invention, which exhibits some of the features of the third embodiment as well as some of the features of the fourth embodiment. Here the magnetoresistive element 11' is provided with first and second current path portions 12A and 12B, and terminals 13a, 13b, and 13c, as in FIG. 9. Also, just as in FIG. 9, a constant voltage source 15' is connected to the terminals 13a and 13b. Further, as in the third embodiment, a biasing magnet 24B, fixedly disposed in relation to magnetoresistive element 11', provides a biasing magnetic field $H_B$, while a signal magnet 24S provides a signal magnetic field $H_S$. In this fifth embodiment, the biasing magnetic field $H_B$ magnetizes first and second current path portions 12A and 12B in the longitudinal direction along the direction of flow of current I, while the signal magnet saturates the current path portions in a direction orthogonal to the direction of flow current I. As shown in FIG. 10, signal magnet 24S provides signal magnetic field $H_S$ over an area $A_S$ of length $L_0$ bridging both current path portions 12A and 12B. The bias magnetizing field $H_B$ is applied over an area $A_B$ covering both the current path portions 12A and 12B. As in the third embodiment of this invention shown on FIG. 6, the signal magnet 24S is arranged to be displaceable relative to the magnetoresistive element 11' and the bias magnet 24B. In this fifth embodiment, similarly to the fourth embodiment of FIG. 9, the respective resistances $R_a$ and $R_b$ of the first and second current path portions 12A and 12B change differentially with respect to one another so that the total resistance $R_a+R_b$ will remain constant regardless of longitudinal movement of the signal magnet 24S relative to the magnetoresistive element 11'. Thus, the current I flowing in the current path portions 12A and 12B will remain a constant. In other words, if it is assumed that the lengths of current path portions 12A and 12B are $L_1$ and $L_2$, respectively, that the length of the interval between first and second current path portions 12A and 12B is $L_3$, that the length of the region $A_S$ in the direction of relative displacement is $L_0$, and that the lengths of the parts of current path portions 12A and 12B within the region $A_S$ influenced by the biasing field $H_S$ are $\Delta x_A$ and $\Delta x_B$, respectively, then the resistance values $R_a$ and $R_b$ can be expressed according to the following equations:

$$R_a=(L_1-\Delta x_A)(\rho_\perp \sin^2\theta_B+\rho_{\|}\cos^2\theta_B)+\Delta x_A(\rho_\perp \sin^2\theta_0+\rho_{\|}\cos^2\theta_0) \tag{18}$$

$$R_b=(L_2-\Delta x_A)(\rho_\perp \sin^2\theta_B+\rho_{\|}\cos^2\theta_B)+\Delta x_B(\rho_\perp \sin^2\theta_0+\rho_{\|}\cos^2\theta_0) \tag{19}$$

The angle $\theta_0$ in the above equations (18) and (19) is that between the vector resultant magnetic field, formed from the signal and bias magnetic fields $H_S$ and $H_B$, and the direction of flow of current I. Hence, if signal field $H_S$ is selected to be very large in respect to bias field $H_B$, the above equations (18) and (19) can be simplified by setting $\theta_2=\theta_B$ and $\theta_1=\theta_0$. Thus, in this fifth embodiment, similarly to the fourth embodiment, the total resistance value $R_a+R_b$ between terminals 13a and 13b remains a constant regardless of the relative displacement of the signal magnetizing material 24S, so long as the respective directions of the bias magnetic field $H_B$ and the signal magnetic field $H_S$ remain constant. Also, similarly to the fourth embodiment, a voltage $V_{x5}$ appearing at the output terminal 13c will be proportional to the relative displacement of the magnetoresistive element 11' and the signal magnet 24S. It is apparent that in each of the fourth and fifth embodiments, the magnetic sensor device, when applied with a constant voltage, will act as a magnetoresistive-element based potentiometer. Such a potentiometer can constitute a part of a bridge circuit for accurately measuring a voltage representing relative displacement.

Figure 11:
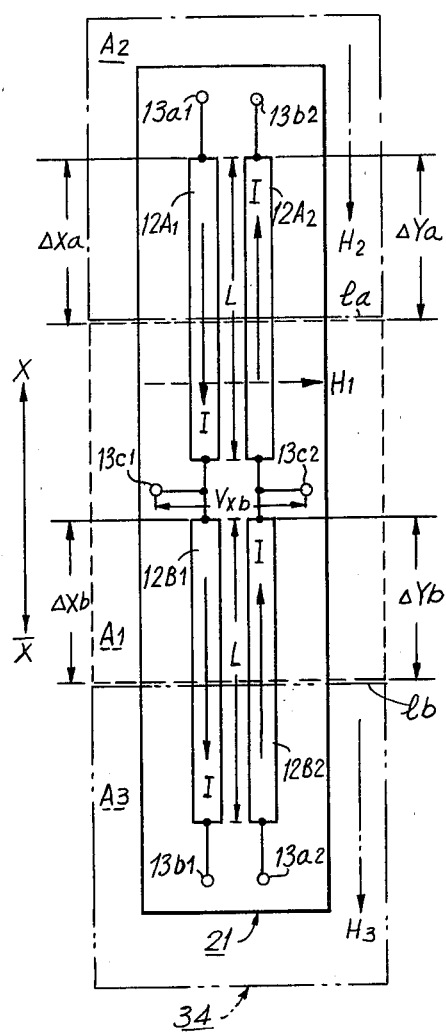
FIG. 11 is a plan view of a sixth embodiment of the present invention.

FIG. 11 illustrates a sixth embodiment of this invention in which a magnetoresistive element 21 constitutes a magnetoresistive bridge circuit. Such element 21 is in essence a pair of potentiometers constructed in a fashion similar to that of the fourth embodiment of FIG. 9.

Magnetoresistive element 21 is constituted from first and second current path portions 12A$_1$ and 12B$_1$, connected in series between input terminals 13a$_1$ and 13b$_1$, and also from third and fourth current path portions 12A$_2$ and 12B$_2$ similarly connected between input terminals 13a$_2$ and 13b$_2$. The junction of current path portions 12A$_1$ and 12B$_1$ and the junction of current path portions 12A$_2$ and 12B$_2$ are respectively connected to first and second output terminals 12c$_1$ and 13c$_2$. The first, second, third, and fourth current path portions 12A$_1$, 12B$_1$12A$_2$, and 12B$_2$ are arranged parallel to one another so as to form first and second potentiometers 12A$_1$, 12B$_1$, and 12A$_2$, 12B$_2$, respectively. A positive voltage is applied to the terminals 13a$_1$ and 13a$_2$ while a negative voltage is applied to terminals 13b$_1$ and 13b$_2$ so that a current I flows in one direction through the first potentiometer 12A$_1$, 12B$_1$, and in the opposite direction through the second potentiometer 12A$_2$, 12B$_2$.

Magnetizing material 34 is arranged to apply a first magnetic field $H_1$, a second magnetic field $H_2$, and a third magnetic field $H_3$ in first region $A_1$, second region $A_2$, and third region $A_3$, respectively. Boundary lines $l_a$ and $l_b$ crossing current path portions 12B$_1$ and 12B$_2$, respectively, separate regions $A_1$ and $A_2$ and separate regions $A_1$ and $A_3$, respectively. In this sixth embodiment, magnetic field $H_1$ lies in the direction transverse to the flow of current I, while magnetic fields $H_2$ and $H_3$ lie in the direction parallel to the flow of current I, and also parallel to the direction of relative displacement of element 21 and magnetizing material 34, as illustrated by the arrow X-X. In this sixth embodiment, the locations of boundary lines $l_a$ and $l_b$ with respect to the current path portions 12A$_1$, 12A$_2$, 12B$_1$, and 12B$_2$ changes with the amount of relative displacement of element 21 and magnetizing material 34. Thus, the resistances of current path portions 12A$_1$ and 12B$_1$ and of current path portions 12A$_2$ and 12B$_2$, constituting the first and second potentiometers, will change differentially, so that the output voltage appearing at the terminals 13$_{c1}$ and 13$_{c2}$ will also change differentially with relative displacement of element 21 and magnetizing material 34, and the output terminals 13$_{c1}$ and 13$_{c2}$ will present an output voltage V$_{x6}$ appearing between them which will change in response to such relative displacement. Further, in this sixth embodiment, if each of the current path portions 12$_{A1}$, 12$_{A2}$, 12$_{B1}$, and 12$_{B2}$ have the same length L, and have equal magnetoresistivities, $\rho_{a1}$, $\rho_{a2}$, $\rho_{b1}$, and $\rho_{b2}$, the magnetoresistive element 21 will provide output voltage V$_{x6}$ as a linear function of relative displacement. Also, if the respective lengths of the parts of first and third current path portions 12A$_1$ and 12A$_2$ in the region A$_2$ influenced by magnetic field H$_2$ are $\Delta x_a$ and $\Delta y_a$, respectively, while the lengths of the second and fourth current path portions 12B$_1$ and 12B$_2$, located in the region of influence A$_1$ of the first magnetic field H$_1$ are $\Delta x_b$ and $\Delta y_b$, respectively, then each of the potentiometers will have a total resistance value R$_x$ and R$_y$, respectively, which can be expressed according to the following equations:

$$R_x = \rho_{a1} + \rho_{b1} = (\rho_{\parallel} - \rho_{\perp})(\Delta x_b - \Delta x_a) + l(\rho_{81} + \rho_{\perp}) \quad (20)$$

$$R_y = \rho_{a2} + \rho_{b2} = (\rho_{81} - \rho_{\perp})(\Delta y_b - \Delta y_a) + L(\rho_{81} + \rho_{\perp}) \quad (21)$$

If it is further assumed $\Delta x_b - \Delta x_a = \Delta y_b - \Delta y_a = d$ then the resistance of each of the potentiometers is equal, so as to permit constant voltage drive, as is apparent from the following equation:

$$R_x = R_y = (\rho_{\parallel} - \rho_{\perp})d + (\rho_{\parallel} + \rho_{\perp})L \quad (22).$$

Figure 12:
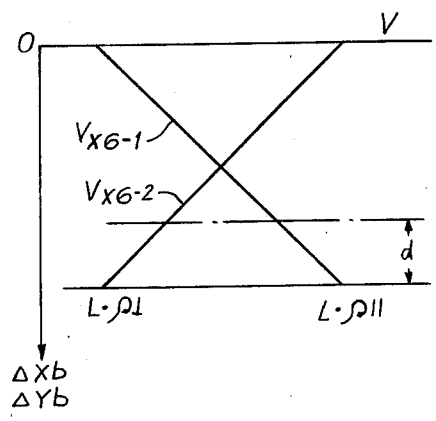
FIG. 12 is a graph showing the resistance characteristic of the magnetoresistive element in the sixth embodiment of this invention.

FIG. 12 illustrates the linear output characteristic displayed by potentiometers 12A$_1$, 12B$_1$, and 12A$_2$, 12B$_2$. Here one curve represents the voltage V$_{x6-1}$ appearing at output terminal 13$_{c1}$ while the other curve represents the voltage V$_{x6-2}$ appearing at output terminal 13$_{c2}$.

Figure 13:
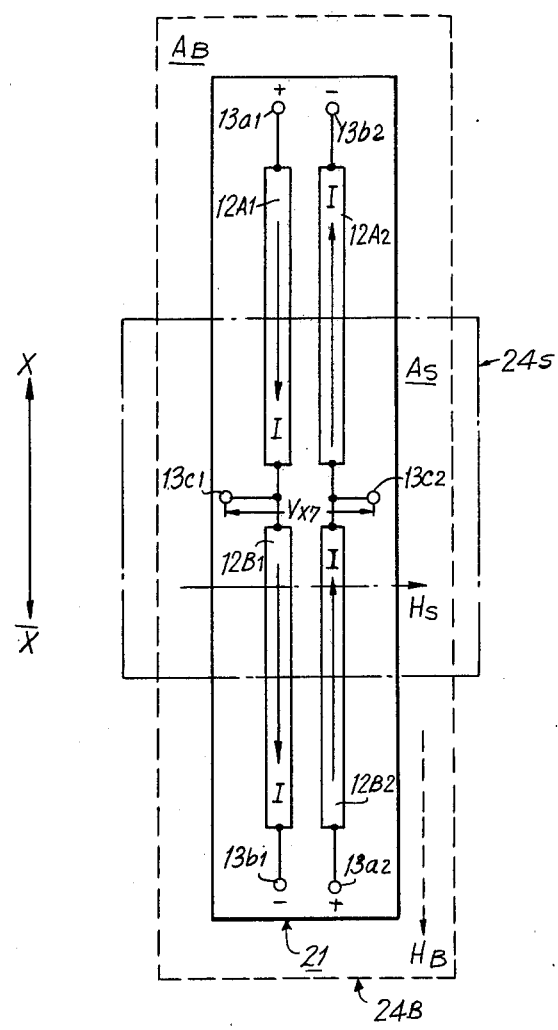
FIG. 13 is a plan view of a seventh embodiment of the present invention.

FIG. 13 illustrates a seventh embodiment of this invention, in which a magnetoresistive element 21 constructed like that of the sixth embodiment above is used in conjunction with biasing magnet 24$_B$ and signal magnet 24$_S$ arranged similarly to those of the fifth embodiment illustrated in FIG. 10. In this embodiment, a positive voltage is applied to terminals 13$_{a1}$ and 13$_{b2}$, and a negative voltage is applied to terminals 13$_{b1}$ and 13$_{a2}$, and an output voltage V$_{x7}$ appears between output terminals 13$_{c1}$ and 13$_{c2}$. Bias magnet 24$_B$ provides a bias magnetic field H$_B$ in the direction of flow of current I throughout an area A$_B$ influencing the entirety of all of the current path portions 12$_{A1}$, 12$_{B1}$, 12$_{A2}$, and 12$_{B2}$. Signal magnet 24$_S$ provides signal magnetic field H$_S$ in the direction transverse to the flow of current I throughout a region A$_S$ spanning the current path portions 12$_{A1}$ and 12$_{B1}$ and also spanning the current path portions 12$_{A2}$ and 12$_{B2}$. The signal magnet 24$_S$ is arranged to be displaced in the direction X-$\overline{X}$ relative to magnetoresistive element 21.

In this seventh embodiment, as signal magnet 24$_S$ is displaced in the direction X-$\overline{X}$, first and second potentiometers formed of current path portions 12$_{A1}$,12$_{B1}$ and 12$_{A2}$,12$_{B2}$, respectively, will operate differentially, so that the voltage V$_{x7}$ appearing between terminals 13$_{c1}$ and 13$_{c2}$ will vary in accordance with relative displacement of signal magnet 24$_S$ and magnetoresistive element 21.

Figure 14:
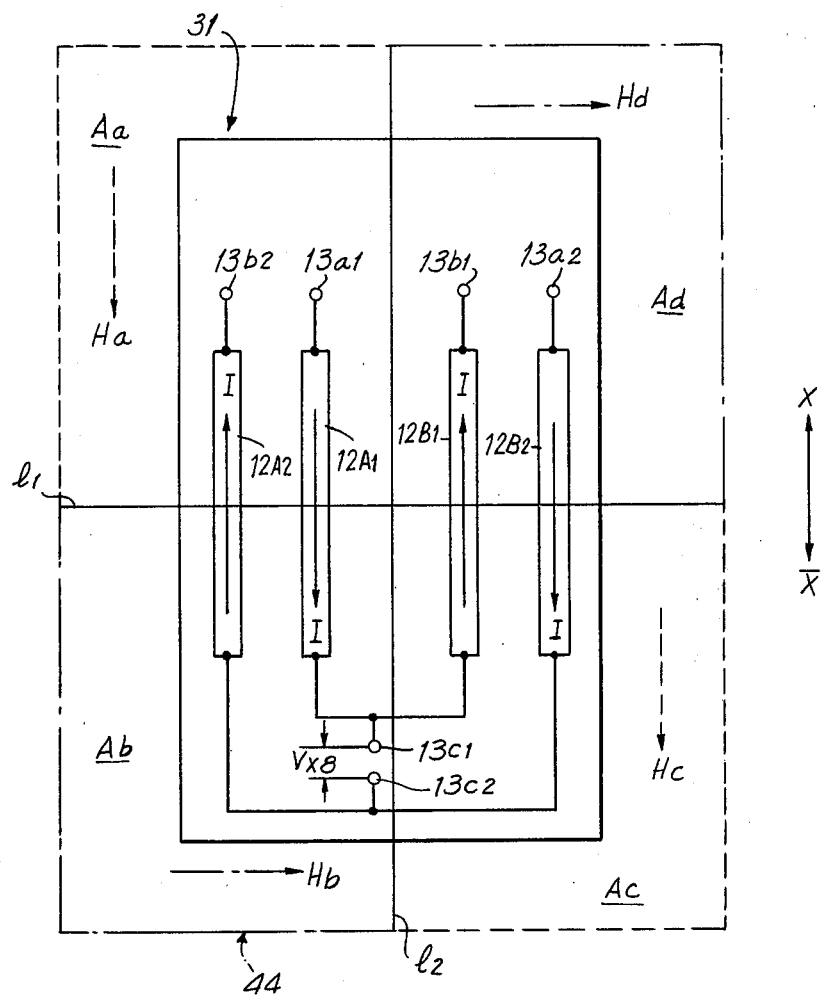
FIG. 14 is a plan view of an eighth embodiment of the present invention.

FIG. 14 illustrates an eighth embodiment of this invention, which, similarly to the seventh embodiment described above, has a magnetoresistive element 31 and magnetic material 44 arranged to constitute a bridge circuit formed of current path portions 12A$_1$' and 12B$_1$' and current path portions 12A$_2$',12B$_2$', connected between input terminals 13$_{a1}$', 13$_{b1}$' and 13$_{a2}$',13$_{b2}$', respectively. The current path portions 12A$_1$',12B$_1$',12A$_2$' and 12B$_2$' are arranged in a side-by-side and parallel fashion. Current path portions 12A$_1$' and 12B$_1$' are connected in series between input terminals 13'$_{a1}$ and 13'$_{b1}$ to form a first potentiometer, with an output terminal 13'$_{c1}$ connected to the junction therebetween. Current path portions 12A$_2$' and 12B$_2$' are connected in series between input terminals 13'$_{a2}$ and 13'$_{b2}$ to form a second potentiometer, with another output terminal 13'$_{c2}$ connected to the junction between the current path portions 12A$_2$' and 12B$_2$'. A positive voltage is coupled to the terminals 13'$_{a1}$ and 13'$_{a2}$ while a negative voltage is coupled to terminals 13$_{b1}$ and 13$_{b2}$, so that the current I flowing in the first potentiometer is equal and opposite to the current flowing in the second potentiometer.

Magnetoresistive element 31 is arranged for relative displacement along the line X-$\overline{X}$ with respect to magnetic material 44. The latter provides magnetic fields H$_a$,H$_b$,H$_c$, and H$_d$ in first through fourth magnetic regions A$_a$,A$_b$,A$_c$, and A$_d$, respectively. The first and second regions A$_a$ and A$_b$ and the third and fourth regions A$_c$ and A$_d$, abut each other at a boundary line l$_1$ which traverses each of the current path portions 12'$_{A1}$,12'$_{A2}$,12'$_{B1}$ and 12'$_{B2}$. The first and fourth regions A$_b$ and A$_c$, abut each other at a boundary line l$_2$ intersecting boundary line l$_1$ and located between current path portions 12'$_{A1}$ and 12'$_{B1}$. Magnetic fields H$_a$ and H$_c$ are parallel to the flow of current I, while magnetic fields H$_b$ and H$_d$ are perpendicular to the flow of current I.

Figure 15:
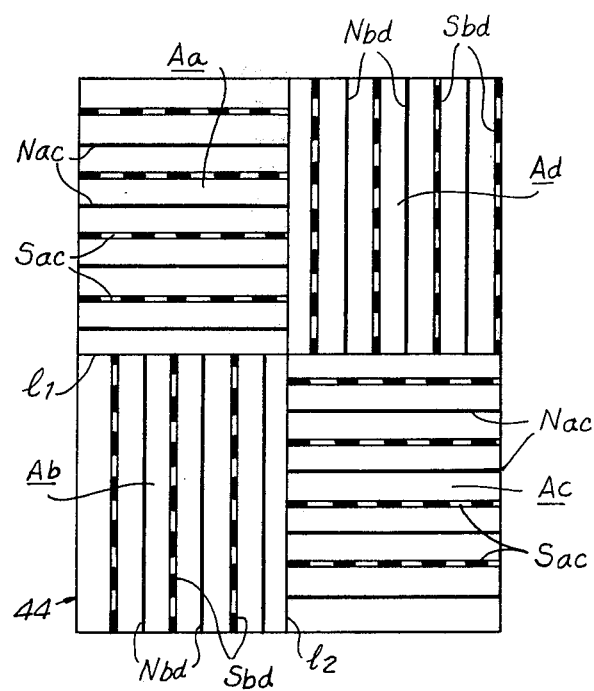
FIG. 15 is a plan view showing a preferred magnetization pattern for magnetic material to be utilized in the eighth embodiment of this invention.

An arrangement of magnetizing material 44 suitable for use in the eighth embodiment of this invention is depicted in FIG. 15. Similar to the arrangement shown in FIG. 4, each of the regions A$_a$, A$_b$,A$_c$, and A$_d$ of the magnetizing material 44 is zone magnetized, that is, is formed of a plurality of successive magnetized strips with each strip being magnetized in the direction across its width, and with adjacent strips being oppositely magnetized. Thus, each of the regions is formed with alternating north and south transverse poles N$_{ac}$ and S$_{ac}$ in regions A$_a$ and A$_c$ and with alternating north and south transverse poles N$_{bd}$ and S$_{bd}$ in regions A$_b$ and A$_d$. Here, the transverse poles N$_{ac}$ and S$_{ac}$ are parallel to the boundary line l$_1$ and perpendicular to the transverse poles N$_{bd}$ and S$_{bd}$ in regions A$_b$, and A$_d$.

In this eighth embodiment, because the boundary line l$_1$ crosses all of the current path portions 12A'$_1$, 12A'$_2$, 12B'$_1$, and 12B'$_2$ of the magnetoresistive element 31, the lengths of the parts of the latter current path portions influenced by the magnetic fields H$_a$,H$_b$, H$_c$, and H$_d$ will change with relative movement of magnetoresistive element 31 relative to boundary line l$_1$. Thus, the first potentiometer, formed of current path portions 12'$_{A1}$ and 12'$_{B1}$, and the second potentiometer, formed of current path portions 12'$_{A2}$ and 12'$_{B2}$, will be differentially operated in response to such displacement so that an output voltage V$_{x8}$ presented between the output terminals $13'_{c1}$ and $13'_{c2}$ varies linearly with such displacement.

Figure 16:
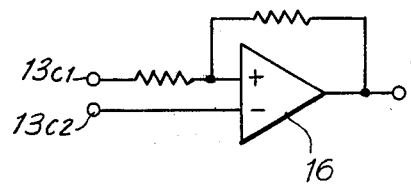
FIG. 16 is a circuit diagram showing a differential amplifier which can be used in conjunction with any of the sixth, seventh, and eighth embodiments of this invention.
Figure 17:
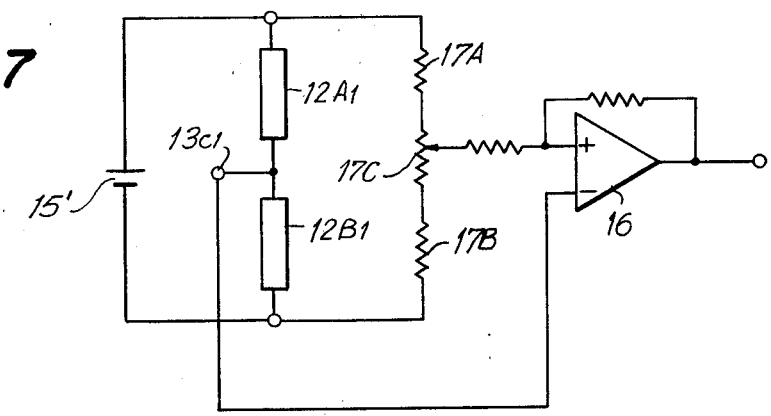
FIG. 17 is a circuit diagram showing the connection of a differential amplifier with either of the sixth and seventh embodiments of this invention.

FIGS. 16 and 17 illustrate how a differential amplifier 16 can be coupled with any of the sixth, seventh, or eighth embodiments of this invention shown on FIGS. 11, 13 and 14, respectively. The differential amplifier 16, here constructed on an operational amplifier, has a positive input connected to terminal $13_{c1}$ and a negative input coupled to terminal $13_{c2}$. Further, as illustrated in FIG. 17, a potentiometer formed of resistors 17A,17B and variable resistor 17C can be connected in parallel with a magnetoresistive element, such as that depicted in FIG. 8, to form a bridge circuit. Thus, one of the input terminals of amplifier 16 can be connected to terminal $13_{c1}$ and the other terminal can be connected to the movable tap of resistor 17C.

Figure 18:
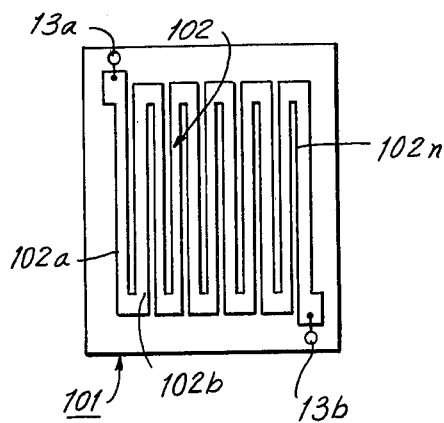
FIG. 18 is a plan view of the construction of an alternative arrangement of the magnetoresistive element according to this invention.

FIG. 18 shows an alternative arrangement of a magnetoresistive element 101 for use with the present invention. Here, a plurality of parallel strips 102a, 102b, . . . 102n are coupled together in series to form a current path portion 102 in a serpentine or raster configuration between terminals 13a and 13b. This configuration is sometimes referred to as a "meandering" configuration, because the current I meanders back and forth, rather than proceeding in a straight line between terminals 13a and 13b. It should be appreciated that the impedance of serpentine current path portion 102 will be significantly greater than the impedance of current path portion 12 of, for example, the first embodiment of FIG. 2 so that devices utilizing a serpentine magnetoresistive element, such as element 101, will exhibit a greater sensitivity to relative displacement.

Figure 19:
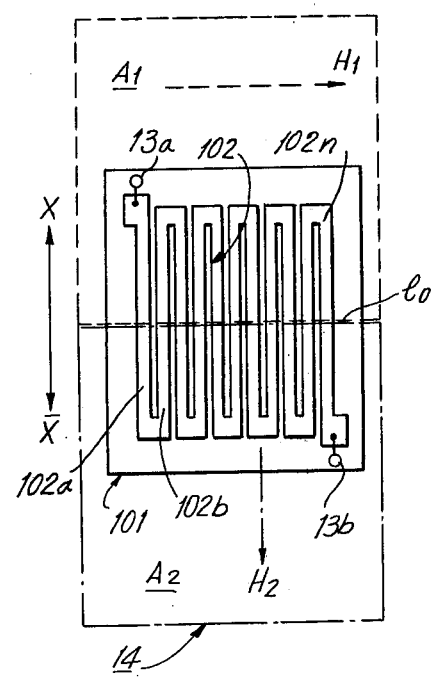
FIG. 19 is a plan view showing a ninth embodiment of the present invention.

FIG. 19 shows a ninth embodiment of this invention, in which the magnetoresistive element 101 of FIG. 18 is utilized with magnetizing material 14 such as that of the embodiment illustrated in FIG. 3. In this ninth embodiment, the magnetoresistive element 101 is disposed so that the parallel strips 102a, 102b . . . 102n of the current path portion 102 cross boundary line $l_0$ and are perpendicular thereto. Thus, in this embodiment, since the impedance thereof is increased by a factor equal to the number of strips 102a, 102b . . . 102n, the ninth embodiment will be especially sensitive to fine displacement of the element 101 relative to magnetizing material 14.

Figure 20:
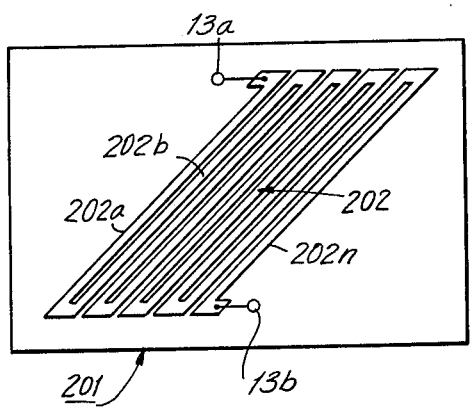
FIG. 20 is a plan view showing a modification of the magnetoresistive element of FIG. 18.

FIG. 20 shows another magnetoresistive element 201 for use with this invention. In the element 201, a current path portion 202 is formed of a plurality of parallel strips 202a, 202b . . . 202n connected in series together between terminals 13a and 13b. However, in this serpentine arrangement, unlike that shown in FIG. 18, the parallel strips are arranged at a slant angle with respect to the direction of this relative displacement between the element 201 and a source of magnetic field. This arrangement permits the element 201 to be used with magnetizing material in which the magnetic field occurs at a corresponding slant angle with respect to the direction of displacement, so that it is unnecessary to have the magnetic fields $H_1$ and $H_2$ occuring in the directions as shown in FIG. 19. In fact, magnetoresistive element 201 can be constructed to operate with magnetic fields at any arbitrary angle.

FIG. 21 illustrates a tenth embodiment of this invention. In this tenth embodiment, similar reference characters identify elements in common with those shown in FIG. 19. Here, however, unlike the ninth embodiment, parallel strips 102a, 102b . . . 102n are arranged parallel to the boundary line $l_0$ and perpendicular to the direction of relative displacement shown by arrow X-X. A constant current source 15 is connected to terminals 13a and 13b, so that an output voltage $V_{x10}$ appears across terminals 13a and 13b. Because the parallel strips 102a, 102b, . . . 102n are perpendicular to the direction of relative displacement X-X, and parallel to the boundary line $l_0$, the output voltage $V_{x10}$ will appear as a stepwise function of the amount of displacement $\Delta_{x10}$, as illustrated in the chart of FIG. 22.

Another alternative arrangement is possible utilizing the slant-angled element 201 in place of either the element 101 of the ninth embodiment on FIG. 19 or the element 101 of the tenth embodiment on FIG. 21.

FIG. 23 illustrates a magnetoresistive element 111 which has first and second current path portions 102A and 102B connected in series together between terminals 13a and 13b, and each of which portions is formed as a serpentine arrangement of parallel strips of ferromagnetic material. Magnetoresistive element 111 can be advantageously applied as a potentiometer in the fourth and fifth embodiments of this invention as described above with reference to FIGS. 9 and 10.

Figure 24:
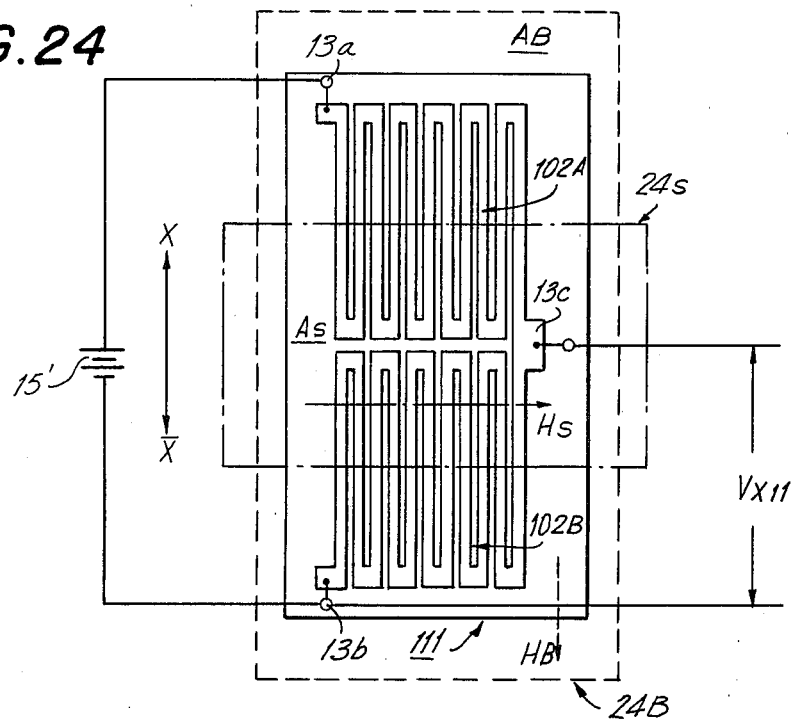
FIG. 24 is a plan view showing an eleventh embodiment of the present invention.

In particular, FIG. 24 shows an eleventh embodiment of this invention, which is formed of magnetoresistive element 111 applied to the fifth embodiment (FIG. 10). In this eleventh embodiment, first and second serpentine current path portions 102A and 102B are connected to voltage source 15', as in the fifth embodiment. An output terminal 13c, which is coupled to the junction of current path portions 102A and 102B, provides an output voltage $V_{x11}$. Here, as in the fifth embodiment, bias magnet $24_B$ provides a biasing magnetic field $H_B$ in the direction parallel to the magnetic strips, while signal magnet $24_S$ provides signal magnetic field $H_S$ in the direction across the parallel strips. Signal magnet $24_S$ and magnetoresistive element 111 are disposed to be displaceable relative to each other in the direction X-X of the parallel strips. In this eleventh embodiment, the current path portions 102A and 102B change their respective resistances differentially as do the current path portions 12A and 12B of the above-described fifth embodiment of FIG. 10. However, because of their serpentine configurations, current path portions 102A and 102B will have a relatively higher impedance and will thus be more sensitive to movement of the signal magnet $24_S$ relative to magnetoresistive element 111. Thus, output voltage $V_{x11}$ will be much more sensitive to the relative displacement of magnetoresistive element 111 and signal magnet $24_S$ than is output voltage $V_{x5}$ of the fifth embodiment.

FIGS. 25–29 illustrate alternative practical arrangements of the above-described eleventh embodiment. In each of FIGS. 25–29, bias magnet $24_B$ is fixedly secured, by adhesive or the like, to a substrate 18, on which magnetoresistive element 111 is formed. The bias magnetic field $H_B$ is normally sufficient to magnetically saturate current path portions 102A and 102B in the direction along their lengths. Signal magnet $24_S$ is disposed to be displaced relative to magnetoresistive element 111 and bias magnet $24_B$.

Figure 25:
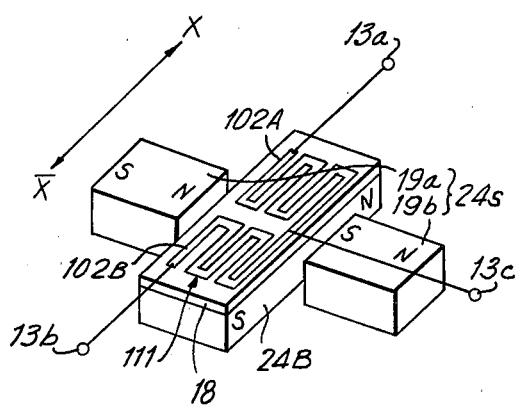
FIGS. 25-29 are perspective views showing more detailed examples of the eleventh embodiment of this invention.

In the arrangement of FIG. 25, signal magnet $24_S$ consists of opposed permanent magnets $19_a$ and $19_b$ located on opposite sides of bias magnet $24_B$ and magnetoresistive element 111. Opposite poles of magnets $19_a$ and $19_b$ are arranged to face each other.

Figure 26:
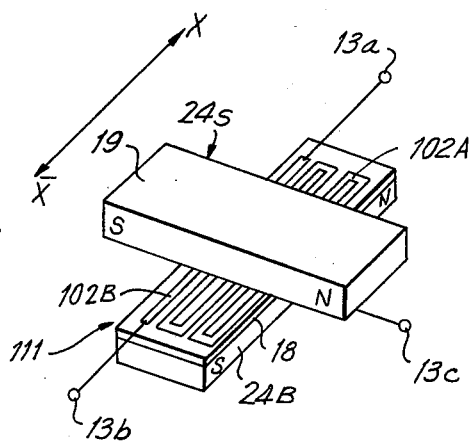

In the arrangement show in FIG. 26, signal magnet $24_S$ is a magnet 19, such as a permanent magnet, lying across the magnetoresistive element 111 transverse to the direction of biasing magnet $24_B$, so as to generate a flux perpendicular to the predetermined direction of displacement between signal magnet $24_S$ and magnetoresistive element 111.

Figure 27:
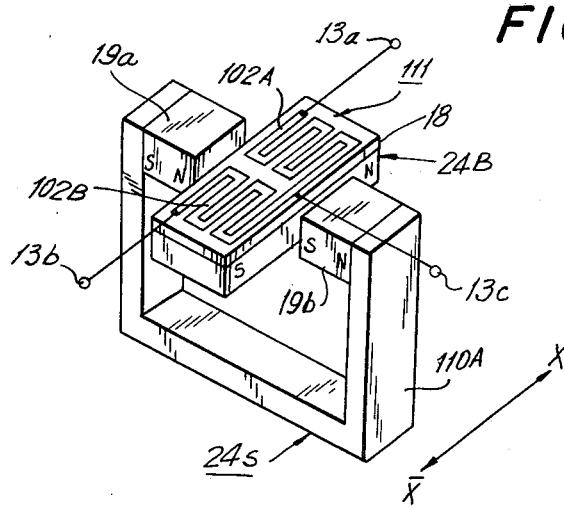
Figure 28:
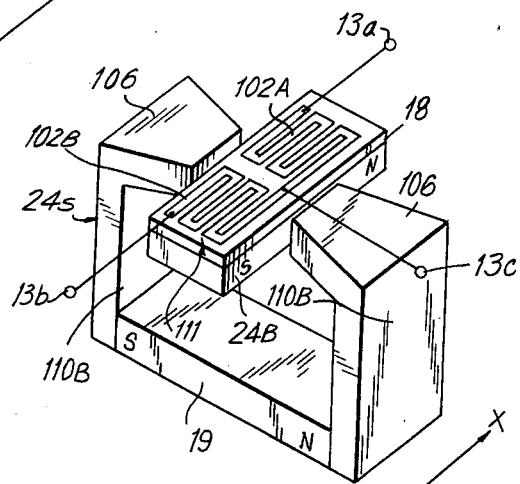

As shown in FIG. 27, the signal magnetic field provided by the arrangement of FIG. 25 can be increased by including a magnetic yoke 110A with permanent magnets $19_a$ and $19_b$ to provide a path for magnetic flux therethrough. Also, as illustrated in FIG. 28, the signal magnetic field of the arrangement in FIG. 26 can be intensified by providing magnetic yokes 110B on the permanent magnet 19. In this case, the magnetic field is still further intensified by use of pole pieces 106 included on the magnetic yokes 110B to converge signal magnetic field $H_S$ in the direction towards the magnetoresistive element 111, thereby focusing the magnetic flux of signal magnetic field $H_S$.

Figure 29:
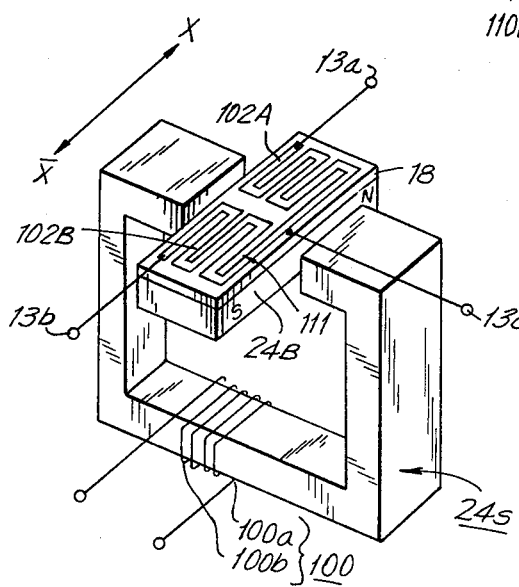

Further, in lieu of the permanent magnet shown in FIGS. 25-28, the signal magnet $24_S$ can include an electromagnet 100 formed of an iron core $100a$ and a winding $100b$, as shown in FIG. 29. In the arrangement utilizing such an electromagnet 100, the intensity of signal magnetic field $H_S$ can be arbitrarily determined by adjusting the amount of current supplied to winding $100b$. Thus, because the material used in bias magnet $24_B$ should be chosen to avoid demagnetization by the signal magnetic field $H_S$.

Further, it should be noted that if the ferromagnetic strips of the first and second current path portions 102A and 102B of element 111 are arranged perpendicular to the direction of displacement between element 111 and signal magnet $24_S$, a stepwise output voltage, similar to the output voltage $V_{x10}$ on FIG. 22, will be provided at the output terminal $13_c$.

Figure 30:
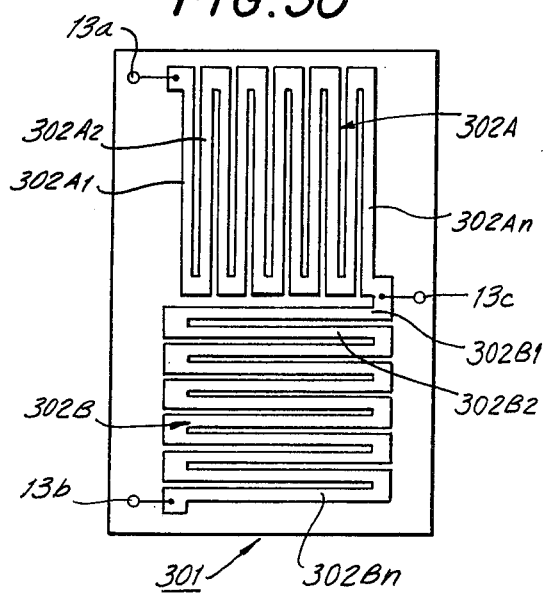
FIG. 30 is a plan view showing another alternative arrangement of the ferromagnetic element of this invention.

Still another magnetoresistive element 301 is illustrated in FIG. 30. This magnetoresistive element 301 has first and second current path portions 302A and 302B each formed of a serpentine arrangement of parallel ferromagnetic strips $302A_1, 302A_2, \ldots 302A_n$ and $302B_1, 302B_2, \ldots 302B_n$, respectively. However, here the strips $302A_1, 302A_2, \ldots 302A_n$ are perpendicular to the strips $302B_1, 302B_2, \ldots 302B_n$. Such magnetoresistive element 301 can be advantageously applied to the above-described fourth and fifth embodiments (FIGS. 9 and 10), to constitute a potentiometer which provides a stepwise-changing output voltage.

Figure 31:
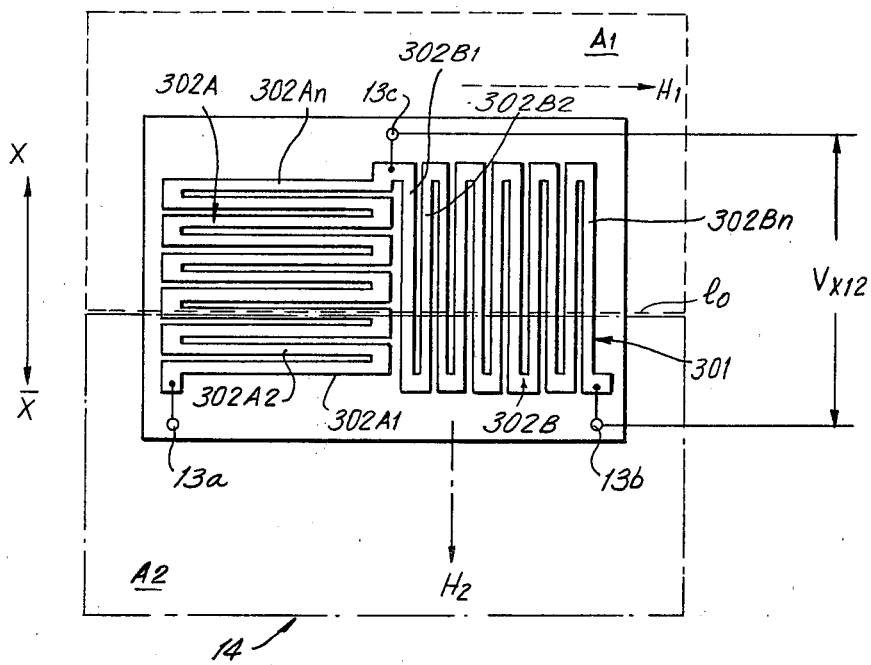
FIG. 31 is a plan view of a twelfth embodiment of this invention.

Further, FIG. 31 illustrates a twelfth embodiment of this invention, in which magnetoresistive element 301 is applied with magnetizing material 14 similar to that of the first embodiment illustrated in FIG. 3. In this embodiment, magnetoresistive element 301 is disposed on magnetizing material 14 so that boundary line $l_0$ thereof traverses both first and second current path portions 302A and 302B, the boundary line being parallel to strips $302A_1, 302A_2, \ldots 302A_n$, and being perpendicular to strips $302B_1, 302B_2, \ldots 302B_n$. Magnetoresistive elements 301 and magnetizing material 14 are disposed for relative displacement in the direction X-X perpendicular to boundary line $l_0$. In this twelfth embodiment, a constant voltage is applied between terminals $13_a$ and $13_b$, and an output voltage $V_{x12}$ appears between terminals $13_c$ and $13_b$. The arrangement of magnetoresistive element 301 in this twelfth embodiment, here used as a potentiometer, considerably simplifies the construction of magnetizing material 14.

Figure 32:
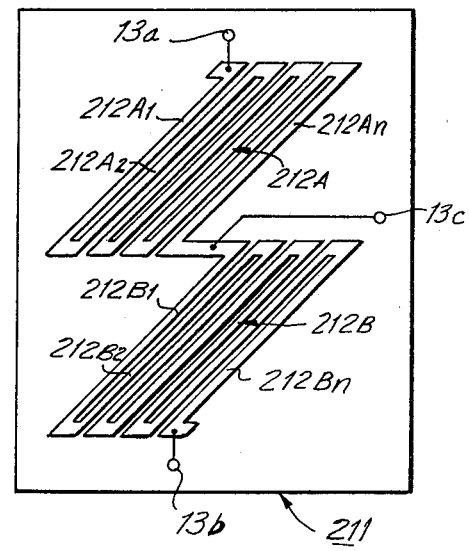
FIG. 32 is a plan view showing yet another variation of the magnetoresistive element of this invention.

FIG. 32 illustrates another alternative magnetoresistive element 211. Magnetoresistive element 211, similar to element 111, is formed of first and second current path portions 212A and 212B, each respectively formed of a serpentine pattern of parallel ferromagnetic strips $212A_1, 212A_2, \ldots 212A_n$, and $212B_1, 212B_2, \ldots 212B_n$. Here, the ferromagnetic strips $212A_1, 212A_2, \ldots 212B_n$ are all arranged at a predetermined slant angle to the relative direction of displacement of magnetoresistive element 211 and a magnetic field. In this mmagnetostrictive element 211, first and second current path portions 212A and 212B, arranged as a potentiometer, are connected in series between terminals $13a$ and $13b$, and the junction therebetween is coupled to output terminal $13c$.

Figure 33:
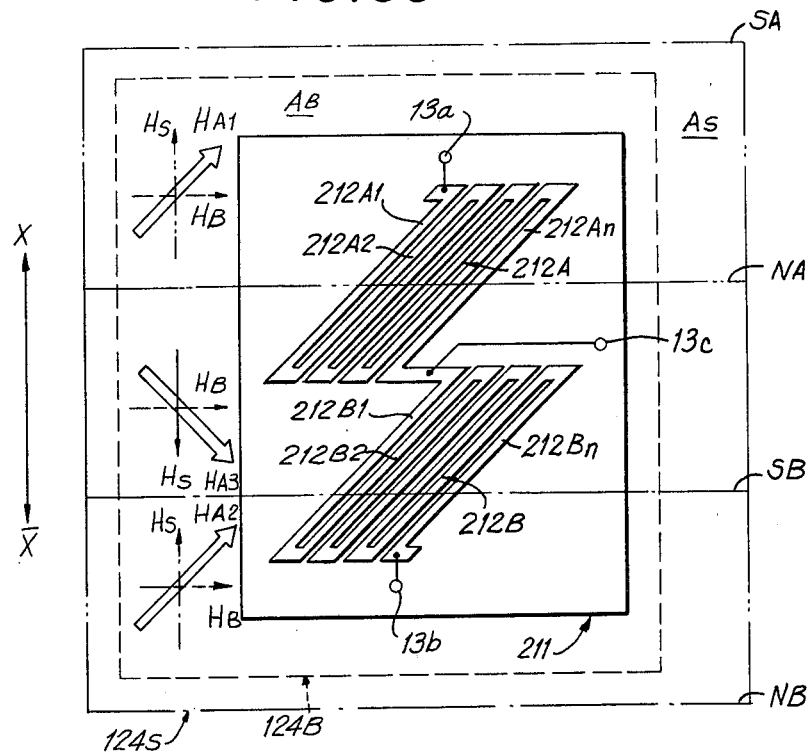
FIG. 33 is a plan view showing a thirteenth embodiment of this invention.

FIG. 33 illustrates a thirteenth embodiment of this invention using magnetoresistive element 211 to form a potentiometer. In this thirteenth embodiment, a biasing magnet $124_B$ fixedly attached to magnetoresistive element 211, provides a bias magnetic field $H_B$ in the direction transverse to predetermined direction of displacement X-X. A signal magnet $124_S$, arranged for displacement with respect to element 211 and bias magnet $124_B$, is constituted by parallel regions $A_S$, each of which provides signal magnetic field $H_S$ in a direction perpendicular to that of bias field $H_B$. However, the direction of the signal magnetic field $H_S$ is reversed in each successive region $A_S$. In this embodiment, signal magnet $124_S$ has transverse poles $S_A, N_A, S_B$ and $N_B$, each extending across the direction of displacement between the magnetoresistive element 211 and the signal magnet $124_B$. The signal magnetic field is reversed at each of the poles $N_A$ and $S_B$. The bias magnetic field $H_B$ and signal magnetic field $H_S$ between poles $S_A$ and $N_A$, and between poles $S_B$ and $N_B$ will combine to form resultant vector magnetic fields $H_{A1}$, and $H_{A2}$, respectively, which lie parallel to the direction of the ferromagnetic strips $212A_1, 212A_2, \ldots 212B_n$, while the bias field $H_B$ and signal magnetic field $H_S$ between poles $N_A$ and $S_B$ will combine to form a vector magnetic field $H_{A3}$ lying in the direction perpendicular to the ferromagnetic strips in the region which influences both current path portions 212A and 212B.

Magnetoresistive element 211 is preferably disposed parallel to the isomagnetic surface of signal magnetic field $H_S$ produced by signal magnet $124_S$, and $H_S$ is displaceable relative to signal magnet $124_S$ in the direction of the magnetic field $H_S$.

Figure 34:
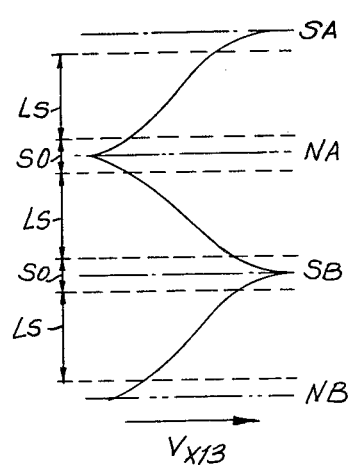
FIG. 34 is a graph showing the relationship of output voltage to displacement in the thirteenth embodiment.

In this thirteenth embodiment, as shown in the chart of FIG. 34, output voltage $V_{x13}$ varies gradually when magnetoresistive element 211 is displaced in the regions $S_0$ near the transverse magnetic poles $S_A, N_A, S_B$, and $N_B$, but varies substantially linearly once magnetoresistive element 211 is disposed in the areas $L_S$ outside the regions $S_0$. Despite the existence of nonlinear regions $S_0$, as discussed in relation to the second embodiment (FIG. 5), the variation of output voltage $V_{x13}$ with displacement will be substantially linear so long as the width of each region $S_0$ is constant.

Figure 35:
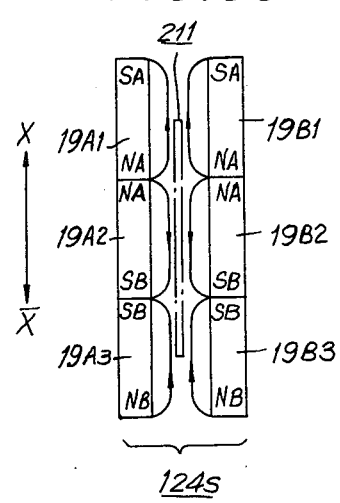
FIG. 35 is an edge-on view of the thirteenth embodiment of this invention.

Furthermore, to obtain more nearly perfect linearity of output voltage from magnetoresistive element 211, the isomagnetic surface of the signal magnetic field $H_S$ should be planar, and the magnetoresistive element 211 should be disposed in the plane of the isomagnetic surface. For example, such a planar isomagnetic surface can be realized by employing the structure of FIG. 35 for signal magnet $124_S$. More particularly, signal magnet $124_S$ should be formed of opposed pairs of magnets $19_{A1}, 19_{B1}; 19_{A2}, 19_{B2};$ and $19_{A3}, 19_{B3}$, with magnets $19_{A1}, 19_{A2}$ and $19_{A3}$ being on one side of element 211, and magnets $19_{B1}, 19_{B2}$ and $19_{B3}$ being on the other.

Figure 36:
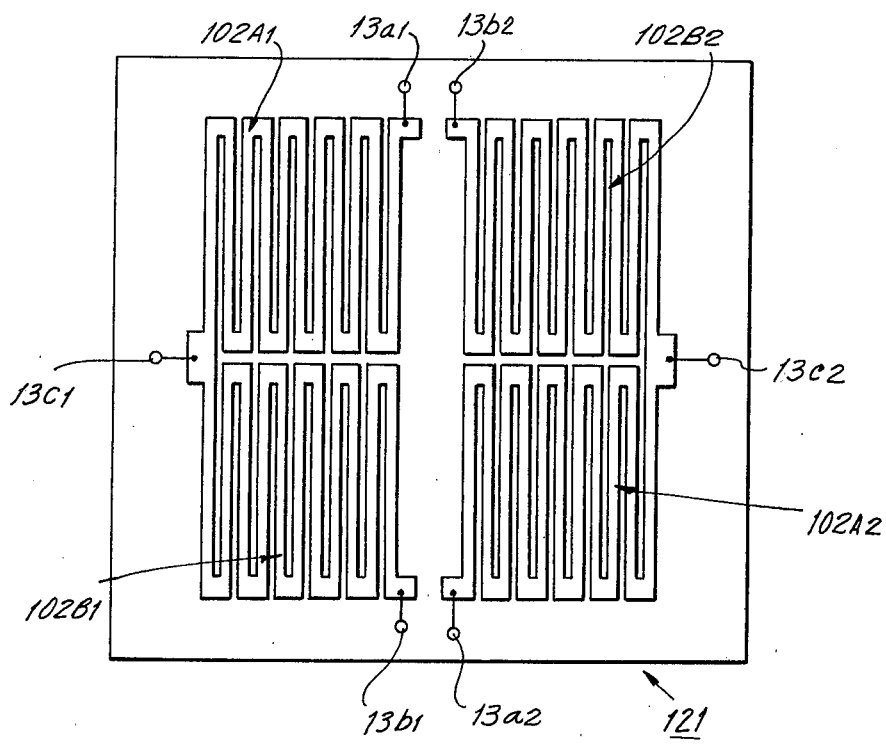
FIG. 36 is a plan view of still another variation of the magnetoresistive element of this invention.

FIG. 36 illustrates a magnetoresistive element 121 which is constituted by first, second, third, and fourth current path portions 102A$_1$, 102B$_1$, 102A$_2$, and 102B$_2$, each of which is a serpentine configuration of ferromagnetic strips connected together so that the pairs of current path portions 102A$_1$, 102B$_1$ and 102A$_2$, 102B$_2$, constitute two potentiometers. Such a magnetoresistive element 121 will have a high impedance, so that if applied, for instance, to the sixth or seventh embodiments described above (FIGS. 11 and 13), a magnetic sensor device of extremely high sensitivity suitable for detecting fine displacement can be constructed.

Figure 37:
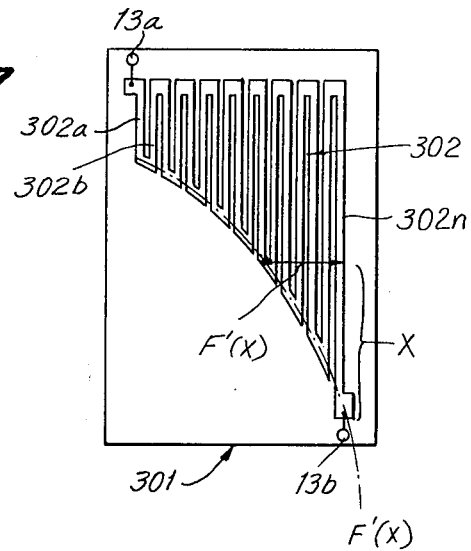
FIG. 37 is a plan view of another version of the magnetoresistive element according to this invention.
Figure 38:
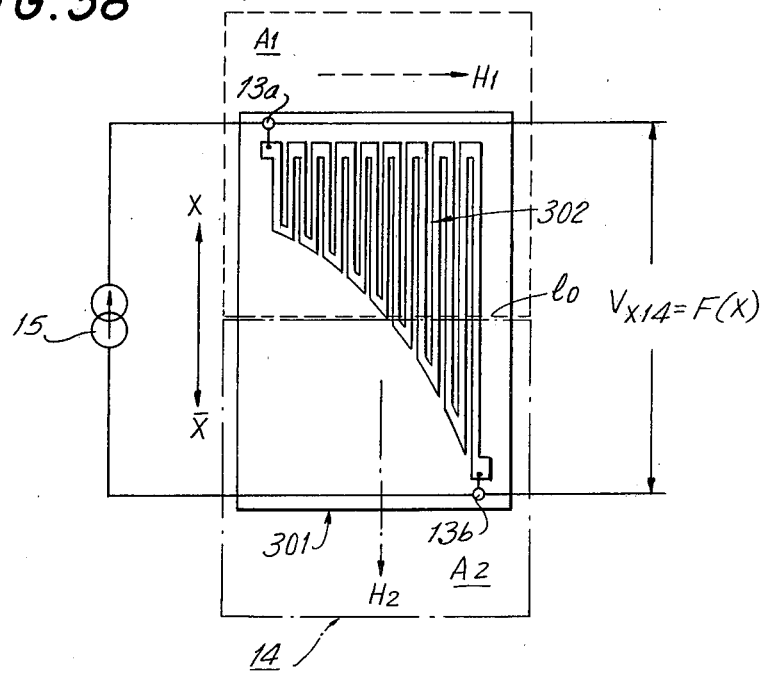
FIG. 38 is a plan view showing a fourteenth embodiment of the present invention.

FIGS. 37 and 38 illustrate a fourteenth embodiment of the present invention.

As shown in FIG. 37, a magnetoresistive element 301 is constituted by a current path portion 302 coupled at its ends to terminals 13a and 13b. Current path portion 302 is formed of a plurality of parallel ferromagnetic strips 302a, 302b, 302n, connected together in a series. In this embodiment, the strips 302a, 302b, . . . 302n are of varying lengths, so that while upper ends of the strips 302a, 302b, . . . 302n are aligned, the lower ends thereof serve to define an arbitrary geometric line or curve. In other words, the serpentine configuration of parallel strips 302a, 302b, . . . 302n defines a geometric shape having one slanted side, so that the distance measured between a point on that slanted side and an edge of the geometric shape formed by the last one of the strips 302n, will vary as a function F' (X) where X is the distance measured along the last ferromagnetic strip 302n to such point. The function F' (X) is illustrated in the chain line on FIG. 37. The fourteenth embodiment of this invention, as shown in FIG. 38, is provided with the magnetoresistive element 301 of FIG. 37, and magnetizing material 14 like that of the first embodiment (FIG. 3). Magnetoresistive element 301 and magnetizing material 14 are arranged for relative displacement in the direction parallel to ferromagnetic parallel strips 302a, 302b, . . . 302n, and perpendicular to boundary line l$_0$. Here, the serpentine pattern of current path portion 302 defines a geometrical shape one side of which intersects the boundary line at a slant angle so that a segment of the boundary line l$_0$ crossing the serpentine pattern is defined by the intersection of the boundary line with that one side and with another side formed by the last ferromagnetic strip 302n. The length of the boundary line l$_0$ crossing the serpentine pattern varies as a varying function of the relative displacement of the magnetoresistive element 301 and boundary line l$_0$. In this embodiment, it is apparent that the change in output voltage V$_{x14}$ appearing across terminals 13a and 13b will depend upon the area of the geometrical shape lying in the field of influence of magnetic field H$_2$, so long as the strips 302a, 302b, . . . 302n are of constant width. In other words, the voltage V$_{x14}$ will be proportional to the integral of the function F' (X). Therefore, the function F' (X) should be selected as the first derivative of a desired function F (X) defining a desired relationship between the output voltage V$_{x14}$ and displacement.

Although illustrative embodiments of this invention have been described in detail herein with reference to the accompanying drawings, it is to be understood that this invention is not limited to those precise embodiments, and that various changes and modifications may be effected therein by one skilled in the art without departing from the spirit of this invention, which is defined in the appended claims.

We claim:

1. A magnetic displacement sensor device comprising:
    a magnetoresistive element having at least one current path portion formed of ferromagnetic material;
    source means supplying a current to said magnetoresistive element to flow along a current path in said at least one current path portion; and
    magnetizing means providing magnetic fields to influence said magnetoresistive element and including a first magnetic field and a second magnetic field lying at different mutually intersecting first and second directions in respect to said at least one current path, and occurring in first and second regions, with the direction of each of said first and second magnetic fields being substantially in a respective one of said directions relative to said at least one current path within the respective first and second regions and changing abruptly to the other of said intersecting directions at boundaries between said first and second regions;
    said magnetoresistive element and said magnetizing means being mutually displaceable in a predetermined direction relative to one another so that the relative amounts of said at least one current path portion that are influenced by said first magnetic field and by said second magnetic field vary in accordance with such relative displacement.

2. A magnetic displacement sensor device according to claim 1, wherein said current path portion is formed of a metal film of a ferromagnetic alloy.

3. A magnetic displacement sensor device according to claim 2, wherein said alloy is selected from a group consisting of Ni-Co, Ni-Fe, Ni-Al, Ni-Mn, and Ni-Zn.

4. A magnetic displacement sensor device according to claim 1, wherein said first and second regions are separated by a boundary line, and said magnetoresistive element and said boundary line are displaceable relative to one another in a direction across said boundary line.

5. A magnetic displacement sensor device according to claim 4, wherein said magnetizing means is formed of a plurality of successive magnetized strips, with each strip being magnetized in the direction across the strip and adjacent strips being oppositely magnetized; and wherein the orientation of the magnetic strips in said first region is different from the orientation of the magnetic strips in said second region.

6. A magnetic displacement sensor device according to claim 5, wherein said first and second regions abut one another at said boundary line.

7. A magnetic displacement sensor device according to claim 4, wherein said at least one current path portion is formed as a serpentine pattern of parallel strips connected in series together.

8. A magnetic displacement sensor device according to claim 7, wherein said strips are arranged parallel to said predetermined direction of relative displacement.

9. A magnetic displacement sensor device according to claim 7, wherein said parallel strips are arranged perpendicular to said predetermined direction of displacement and parallel to said boundary line.

10. A magnetic displacement sensor device according to claim 7, wherein said at least one current path portion includes a first element and a second element connected in series to define a junction therebetween, each said element is formed as a serpentine arrangement of parallel strips connected in series together, the strips in said first element are substantially perpendicular to the strips in said second element, and an output is coupled to said junction.

11. A magnetic displacement sensor device according to claim 10, wherein said boundary line crosses both said first and second elements.

12. A magnetic displacement sensor device according to claim 7, wherein said parallel strips are of varying lengths and are connected together such that said serpentine pattern defines a geometrical shape one side of which intersects said boundary line at a slant angle so that a segment of said boundary line crossing said serpentine pattern is defined by the intersections of said boundary line with said one side and with another side of said shape; and the length of said segment varies as a varying function of the relative displacement of said magnetoresistive element and said magnetizing means.

13. A magnetic displacement sensor device according to claim 12, wherein said other side of said geometrical shape lies along the predetermined direction of displacement, and said varying function is the derivative of a function defining a desired relationship between output voltage and displacement.

14. A magnetic displacement sensor device according to claim 4, wherein one of said first and second directions lies substantially parallel to said at least one current path, and the other lies substantially perpendicular thereto.

15. A magnetic displacement sensor device according to claim 4, wherein said source means includes constant current means applying a constant current across said at least one current path portion.

16. A magnetic displacement sensor device according to claim 1, wherein said magnetizing means includes bias magnetizing means for producing a bias magnetic field for magnetically saturating the ferromagnetic material in said at least one current path portion entirely in said first direction; and signal magnetizing means for imparting a signal magnetizing field to a part of said at least one current path portion in a direction different from said first direction so that said part of the at least one current path portion is magnetically saturated entirely in said second direction, said bias magnetizing means being fixed relative to said at least one current path portion, and said signal magnetizing means being displaceable relative to said at least one current path portion.

17. A magnetic displacement sensor device according to claim 16, wherein one of said first and second directions lies substantially parallel to said current path and the other lies substantially perpendicular thereto.

18. A magnetic displacement sensor device according to claim 16, wherein said source means includes constant current means applying a constant current across said at least one current path portion.

19. A magnetic sensor device according to claim 1, wherein said magnetoresistive element has current input terminals, a voltage output terminal, and first and second current path portions coupled in series between said current input terminals and defining a junction therebetween coupled to said voltage output terminal.

20. A magnetic displacement sensor device according to claim 19, wherein the first region and second region of said magnetizing means abut one another at a boundary line across said first current path portion; said magnetizing means further includes a third region providing a third magnetic field in said second direction; and said second and third regions abut one another at another boundary line across said second current path portion.

21. A magnetic displacement sensor device according to claim 19, wherein said magnetizing means includes bias magnetizing means for magnetically saturating the ferromagnetic material in said first and second current path portions entirely in said first direction, and signal magnetizing means for imparting a signal magnetizing field to a part of each of said first and second current path portions so that said parts thereof are saturated entirely in said second direction, said bias magnetizing means being fixed relative to said first and second current path portions, and said signal magnetizing means being displaceable relative to said first and second current path portions.

22. A magnetic displacement sensor device according to claim 19, wherein said first and second current path portions are each formed as a serpentine pattern of parallel strips connected together in series.

23. A magnetic displacement sensor device according to claim 22, wherein said parallel strips are arranged parallel to said predetermined direction of displacement.

24. A magnetic displacement sensor device according to claim 19, wherein said first and second current path portions are each formed as a serpentine pattern of parallel strips connected together in series, and said parallel strips are arranged at a slant angle with respect to said predetermined direction of displacement.

25. A magnetic displacement sensor device according to claim 24, wherein the slant angles in said first and second current path portions are the same, and said magnetizing means includes bias magnetizing means fixed in respect to said magnetoresistive element and providing a bias magnetic field in one direction, and signal magnetizing means having a central region and outer regions, said central region abutting each of said outer regions along a boundary line crossing a respective one of said first and second current path portions in the direction across said predetermined direction of displacement, said central region providing a first signal field in a direction angled with respect to said one direction of the bias magnetic field, and said outer regions each providing a magnetic field in another direction angled with respect to said one direction, so that vector sums of said bias magnetic field and magnetic fields of said central and outer regions lie along said first and said second directions, respectively.

26. A magnetic displacement sensor device according to claim 25, wherein one of said first and second directions is substantially parallel to said parallel strips and the other of said first and second directions is substantially perpendicular to said parallel strips.

27. A magnetic displacement sensor device according to claim 19, wherein one of said first and second directions lies substantially parallel to said current paths, and the other lies substantially perpendicular thereto.

28. A magnetic displacement sensor device according to claim 19, wherein said source means includes constant voltage means applying a constant voltage across said current input terminals.

29. A magnetic displacement sensor device according to claim 19, wherein said magnetoresistive element further has additional current input terminals, another voltage output terminal, and third and fourth current path portions coupled in series between said additional current input terminals and defining another junction therebetween coupled to said other voltage output terminal.

30. A magnetic displacement sensor device according to claim 29, wherein the first region of said magnetizing means and the second region of said magnetizing means abut one another at a boundary line across said first and third current path portions; said magnetizing means further includes a third region providing a third magnetic field in said second direction; and said second and third regions abut one another at another boundary line across said second and fourth current path portions.

31. A magnetic displacement sensor device according to claim 29, wherein said first, second, third, and fourth current path portions are arranged side-by-side and parallel so that the currents flowing through said first and third current path portions are opposite to the currents flowing in said second and fourth current path portions, respectively.

32. A magnetic displacement sensor device according to claim 31, wherein said magnetizing means further has third and fourth magnetic regions providing magnetic fields in said first and second directions, respectively; said first and second regions abutting one another at a boundary line across said first and third current path portions, said third and fourth regions abutting one another substantially at said boundary line across said second and fourth current path portions, and said first and fourth regions and said second and third regions being on the same respective side of said boundary line.

33. A magnetic displacement sensor device according to claim 29, wherein each of said first, second, third, and fourth current path portions is each formed as a serpentine pattern of parallel strips connected in series together.

34. A magnetic displacement sensor device according to claim 33, wherein said parallel strips of said first, second, third, and fourth current path portions are all parallel to one another.

35. A magnetic displacement sensor device according to claim 29, wherein said source means includes constant voltage means applying a constant voltage across said current input terminals and applying a constant voltage across said additional current input terminals.

36. A magnetic displacement sensor device according to claim 35, wherein the constant voltage across said current input terminals is equal in magnitude but opposite in polarity to the constant voltage applied across said additional current input terminals.

37. A magnetic displacement sensor device according to claim 29, wherein said magnetizing means includes bias magnetizing means for magnetically saturating the ferromagnetic material in said first, second, third, and fourth current path portions entirely in said first direction, and signal magnetizing means for imparting a signal magnetizing field to a part of each of said first, second, third, and fourth current path portions so that said parts thereof are saturated entirely in said second direction, said bias magnetizing means being fixed relative to said first, second, third, and fourth current path portions, and said signal magnetizing means being displaceable relative to said first, second, third, and fourth current path portions.

38. A magnetic displacement sensor device according to claim 37, wherein said power source is connected to said current input terminals and to said additional current input terminals so that the current flowing in said first and second current path portions is opposite to the current flowing in said third and fourth current path portions.

39. A magnetic displacement sensor device according to claim 37, wherein said first and second current path portions are each formed as a serpentine pattern of parallel strips connected in series together.

40. A magnetic displacement sensor device according to claim 19, wherein said signal magnetizing means include a pair of opposed permanent magnets located at opposite sides of said magnetoresistive device.

41. A magnetic displacement sensor device according to claim 40, wherein said signal magnetizing means further comprises magnetic yoke means providing a path for magnetic flux for said permanent magnets.

42. A magnetic displacement sensor device according to claim 19, wherein said signal magnetizing means includes a permanent magnet generating a flux perpendicular to said predetermined direction of displacement.

43. A magnetic displacement sensor device according to claim 42, wherein said signal magnetizing means further includes a magnetic yoke providing a path for said magnetic flux.

44. A magnetic displacement sensor device according to claim 43, wherein said magnetic yoke includes pole pieces concentrating said flux in said second region.

45. A magnetic displacement sensor device according to claim 19, wherein said signal magnetizing means includes an electromagnet.

46. A magnetic displacement sensor device according to claim 1, wherein said at least one current path portion is formed as a serpentine pattern of parallel strips connected together in series.

47. A magnetic displacement sensor device according to claim 46, wherein said parallel strips are arranged at a slant angle with respect to said predetermined direction of displacement.

48. A magnetic displacement sensor device according to claim 1, wherein said magnetizing means includes a central region lying between said first region and said second region and abutting the same at first and second boundary lines, respectively, each of which crosses said at least one current path in a direction perpendicular to said predetermined direction of displacement.

49. A magnetic displacement sensor device according to claim 48, wherein said central region provides a magnetic field in a direction intermediate said first and second directions.

* * * * *